United States Patent
Yamanaka et al.

(10) Patent No.: US 6,782,065 B1
(45) Date of Patent: Aug. 24, 2004

(54) METHOD AND APPARATUS FOR REPRODUCING SYSTEM CLOCK IN DIGITAL DATA TRANSMISSION NETWORK

(75) Inventors: Toshihiro Yamanaka, Fukuoka (JP); Takehiko Fujiyama, Kawasaki (JP); Tetsuya Yasui, Fukuoka (JP)

(73) Assignee: Fujitsu Limited, Kawasaki (JP)

(*) Notice: Subject to any disclaimer, the term of this patent is extended or adjusted under 35 U.S.C. 154(b) by 0 days.

(21) Appl. No.: 09/491,151

(22) Filed: Jan. 26, 2000

(30) Foreign Application Priority Data

Feb. 19, 1999 (JP) .......................................... 11-041985

(51) Int. Cl.[7] .............................................. H04L 7/00
(52) U.S. Cl. ...................... 375/356; 370/503; 348/500
(58) Field of Search ................................ 375/354, 356, 375/357, 212; 370/503, 258; 348/500, 510; 327/141, 160, 162

(56) References Cited

U.S. PATENT DOCUMENTS

| | | | | |
|---|---|---|---|---|
| 4,939,752 A | * | 7/1990 | Literati et al. ............... | 370/238 |
| 5,475,717 A | * | 12/1995 | Cordonnier et al. ........ | 375/356 |
| 5,635,875 A | * | 6/1997 | Kusakabe .................... | 331/1 A |
| 5,661,425 A | * | 8/1997 | Minoda et al. ............. | 327/159 |
| 5,901,136 A | * | 5/1999 | Lovelace et al. ........... | 370/217 |
| 6,078,633 A | * | 6/2000 | Shiotsu et al. .............. | 375/374 |
| 6,185,216 B1 | * | 2/2001 | Chapman .................... | 370/402 |
| 6,304,582 B1 | * | 10/2001 | Zhang et al. ................ | 370/503 |
| 6,606,362 B1 | * | 8/2003 | Dalzell et al. ............... | 375/356 |
| 6,628,674 B1 | * | 9/2003 | Tanonaka .................... | 370/503 |

FOREIGN PATENT DOCUMENTS

| | | |
|---|---|---|
| JP | 8-97837 | 4/1996 |
| JP | 9-219857 | 8/1997 |
| JP | 10-112813 | 4/1998 |

\* cited by examiner

*Primary Examiner*—Stephen Chin
*Assistant Examiner*—Dac V. Ha
(74) *Attorney, Agent, or Firm*—Katten Muchin; Zavis Rosenman

(57) ABSTRACT

An apparatus for reproducing a system clock provided with a reproducing unit for reproducing a first time reference clock T1, a generating unit for generating a system clock Sck, a generating unit for generating a second time reference clock T2, a synchronization control unit for minimizing, based on the clocks T1 and T2, the deviation between these clocks, a first calculating unit for calculating a difference between counts of the clock T1 counted in a predetermined time interval, and a second calculating unit for calculating a difference between counts of the clock T2 counted in a predetermined time interval, the outputs of the calculation of the differences being input to the synchronization control unit to minimize the deviation between the clocks, whereby it becomes possible to reproduce high quality data even when switching channels from one node to another node when reproducing digital data from a plurality of sending side nodes at a receiving side node.

24 Claims, 21 Drawing Sheets

Fig.13

| | 33 ------------- 1 | 9 ----- 1 |
|---|---|---|
| CH-1 | BASE 1 | EXT 1 |
| CH-2 | BASE 2 | EXT 2 |
| ⋮ | ⋮ | ⋮ |
| CH-N | BASE N | EXT N |

METHOD AND APPARATUS FOR REPRODUCING SYSTEM CLOCK IN DIGITAL DATA TRANSMISSION NETWORK

BACKGROUND OF THE INVENTION

1. Field of the Invention

The present invention relates to a method and apparatus for reproducing a system clock in a digital data transmission network.

There has been a rapid spread in transmission networks handling multimedia digital data in recent years. Such transmission networks normally are comprised of a plurality of nodes for sending or receiving or both sending and receiving digital data and transmission lines comprised of for example optical fibers for sending digital data among the nodes.

Source information to be sent from one node is coded at that node and sent as digital data through the transmission line to another node. The destination node decodes the received digital data to reproduce the original source information. In this process of coding→transmission→decoding→reproduction, the coding is performed in synchronization with a system clock unique to the origination node of the source information, the transmission is performed by a frequency unique to the transmission line, and the decoding and reproduction are performed in synchronization with a system clock unique to the destination node of the source information. In a conventional transmission network, it was possible to send the source information by performing the above coding and decoding and reproduction using just the above system clock as the time base.

In a transmission network handling the above multimedia digital information, however, the source information may be diverse, that is, video information or audio information or may be computer information, so it is not enough to use just the system clock as the time base. In recent years, a time reference clock has been further incorporated to form the time base. This is so as to enable the destination node to reproduce the information in the packets (cells) in the order in which the origination node intended even if video packets (cells) containing video information and audio packets (cells) containing audio information are transmitted mixed with each other to the destination node.

Therefore, in the above explained transmission network handling multimedia digital information, the system clock at the destination node is reproduced in synchronization with the time reference clock contained in the digital data received from the origination node. The present invention relates to the reproduction of such a system clock synchronized with the time reference clock.

2. Description of the Related Art

As will be explained later with reference to the drawings, when expanding a point-to-point connection configuration transmission network (FIG. 19) into a point-to-multipoint connection configuration transmission network (FIG. 20 or FIG. 21), a means is required for switching channels.

If such a means for channel switching is interposed, however, the operation of switching the channel from a first node to a second node becomes necessary.

If a channel is switched from the first node to the second node, a monitor node which had reproduced its own system clock in synchronization with a first time reference clock from the first node, then, has to reproduce its own system clock in synchronization with a second time reference clock from the second node.

Since the first system clock in the first node and the second system clock in the second node are generated independently in each node, naturally the first time reference clock and the second time reference clock become asynchronous with each other. Therefore, the monitor node which had operated by a system clock synchronized with the first time reference clock becomes out of sync with the newly received second time reference clock immediately after switching the channel from the first node to the second node.

The out-of-sync monitor node then immediately starts a repull-in operation to synchronize its own system clock with the new second time reference clock. Due to this repull-in operation, however, the system clock in the monitor node ends up fluctuating.

When such fluctuation occurs in the system clock, a color irregularity appears in the image reproduced on the monitor of the monitor node and the image ends up being degraded in quality for a certain time. This degradation of the quality of the image lasts for several seconds. In the actual operation of a transmission network, however, when used successively switching images at the monitor in for example 5-second intervals such as from the camera of the first node to the camera of the second node and on to the camera of a third node, the problem arises that a normal image cannot be obtained on the monitor much at all. This poses a serious problem in the case of for example a multi-location television conference system where the participants in the conference are successively shown on a monitor by the cameras at those locations.

SUMMARY OF THE INVENTION

Therefore, an object of the present invention is to provide a method and apparatus for reproducing a system clock in a digital data transmission network which completes a repull-in operation of the system clock at the time of channel switching in an extremely short time and thereby prevents fluctuations in the system clock from occurring.

To attain the above object, according to the present invention, there is provided an apparatus for reproducing a system clock provided with a reproducing unit (21) for reproducing a first time reference clock (T1), a generating unit (26) for generating a system clock (Sck), a generating unit (22) for generating a second time reference clock (T2), a synchronization control unit (25) for minimizing based on the clocks (T1 and T2) the deviation between these clocks, a calculating means (23) for calculating a difference between counts of the first time reference clock (T1) counted in a predetermined time interval, and a calculating means (24) for calculating a difference between counts of the second time reference clock (T2) counted in a predetermined time interval. Thereby, the above deviation between the clocks can be minimized by inputting the above two calculated differences to the synchronization control unit (25). Thus, when reproducing digital data from a plurality of sending side nodes at a receiving node, high quality data can be reproduced even if switching channels from one node to another node.

BRIEF DESCRIPTION OF THE DRAWINGS

The above object and features of the present invention will be more apparent from the following description of the preferred embodiments given with reference to the accompanying drawings, wherein:

FIG. 13 is a view of the example of the format of a time reference clock correction table shown in FIG. 12;

DESCRIPTION OF THE PREFERRED EMBODIMENTS

Before describing the embodiments of the present invention, the related art and the disadvantages therein will be described with reference to the related figures.

Figure 19:
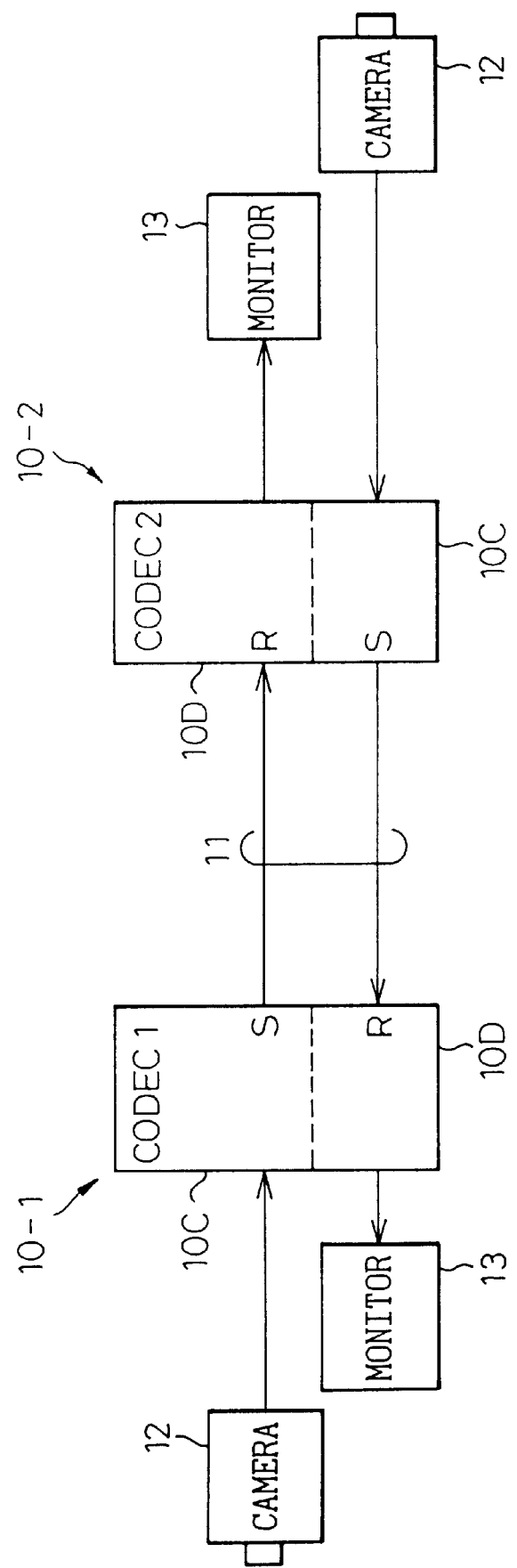
FIG. 19 is a view of a first example of a general transmission network.

FIG. 19 is a view of a first example of a general transmission system.

In the figure, reference numeral 10 indicates a node. In the figure, a first node 10-1 and a second node 10-2 are shown.

The first and second nodes 10-1 and 10-2 are each provided with a camera 12 for providing source information and a monitor 13 for reproducing source information transmitted from an opposing node (10-1 or 10-2). The source information is transmitted between the two nodes through a transmission line 11. Here, as one example, a video information transmission network is formed.

More specifically, the first node 10-1 is realized by a CODEC 1 and the second node 10-2 is realized by a CODEC 2. The CODEC 1 is comprised of a transmission unit 10C (CODER) and a reception unit 10D (DECODER). This configuration is exactly the same in the CODEC 2 as illustrated. Note that "S" in the figure indicates "send" and "R" indicates "receive".

The above first example of a transmission network is a transmission network comprised of so-called point-to-point connection configuration nodes. In such a point-to-point connection configuration transmission network, the number of nodes accommodated ends up being limited to two and there is little occasion at which the transmission network is actually used. Therefore, a transmission network able to accommodate three or more nodes is desired.

Figure 20:
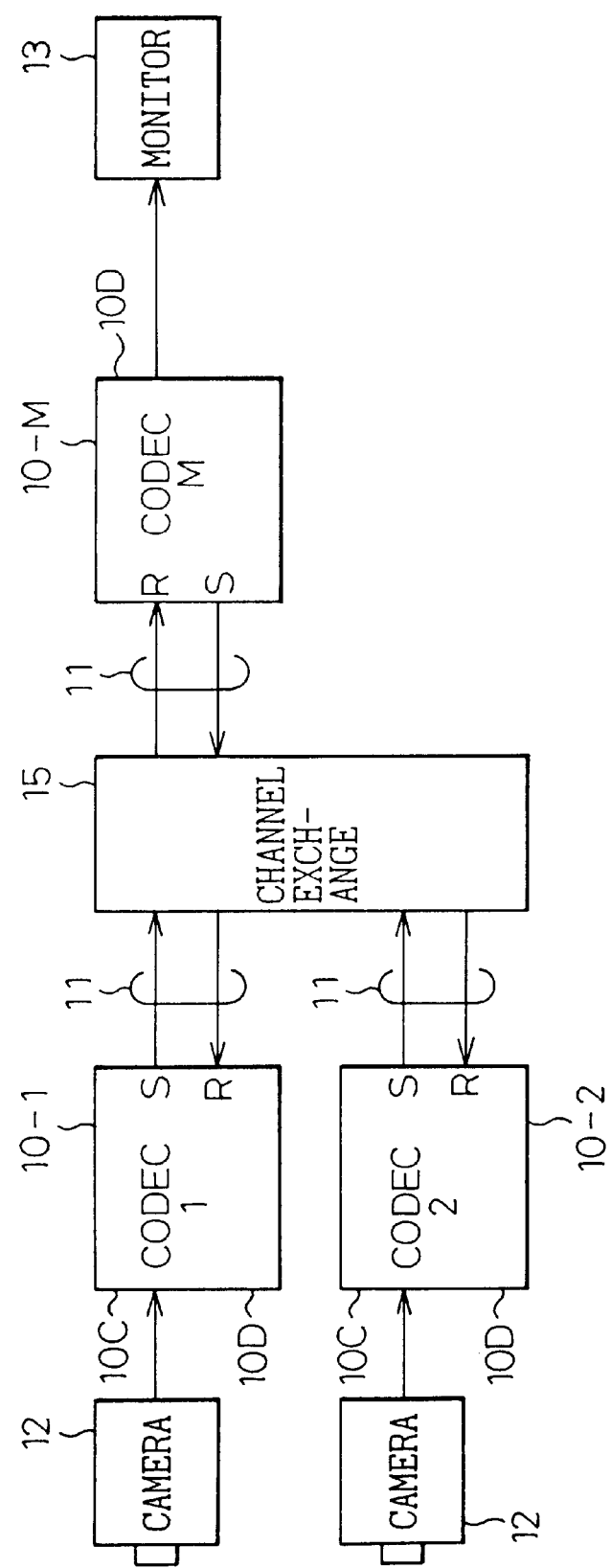
FIG. 20 is a view of a second example of a general transmission network.

FIG. 20 is a view of a second example of a general transmission network. Note that similar components are assigned the same reference numerals or symbols throughout the drawings.

The transmission network of the second example shown in FIG. 20 shows a transmission network comprised of first and second nodes 10-1 and 10-2 for providing source information and a monitor node 10-M for monitoring the source information provided. For example, it is used for a system for monitoring a dam and the area around its reservoir or a security system for crime prevention in a broad area.

As shown in the figure, in the second example of a transmission network, a channel exchange unit 15 is introduced for connecting a plurality of (three or more) nodes, that is, the transmission network is of a so-called channel exchange type.

Figure 21:
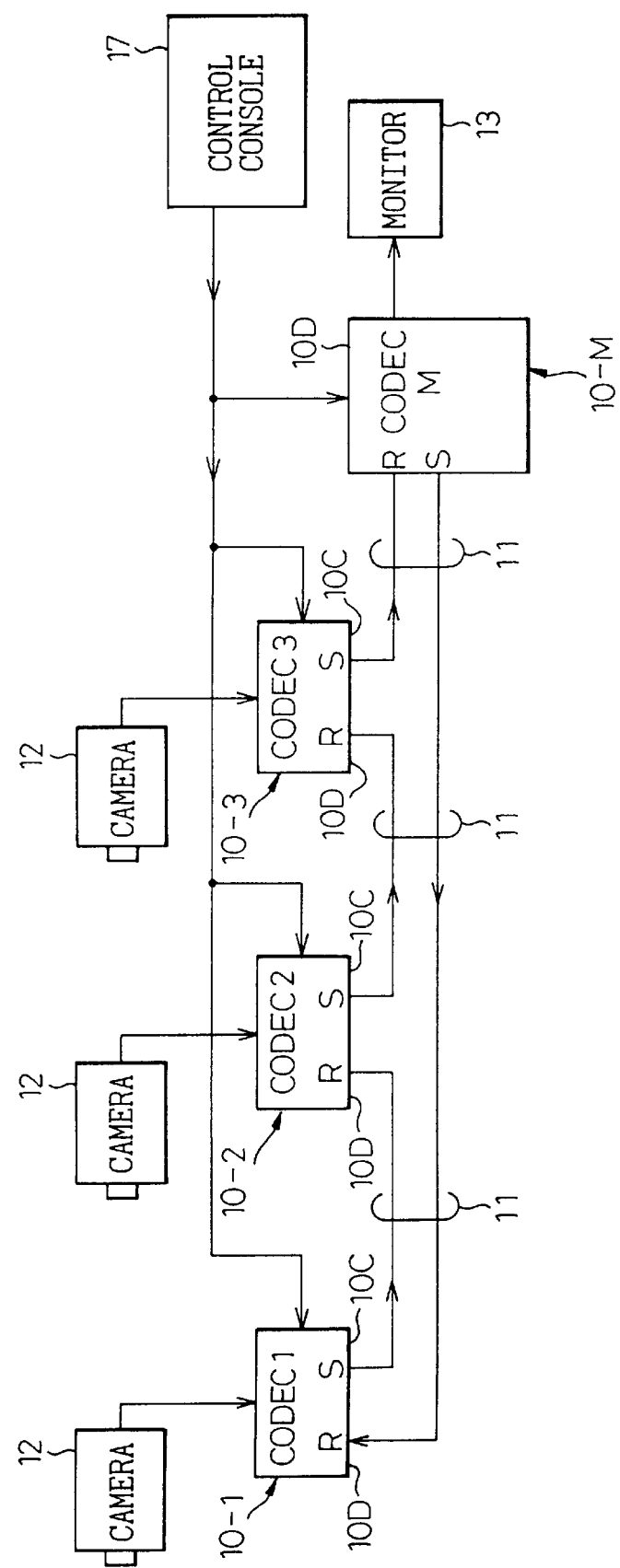
FIG. 21 is a view of a third example of a general transmission network.

FIG. 21 is a view of a third example of a general transmission network.

The third example of a transmission network shown in the figure, like the above second example (FIG. 20) substantially, realizes a channel exchange type transmission network. A plurality of nodes 10-1, 10-2, 10-3, and 10-M are accommodated in the network.

The function of the channel exchange is performed by the control console 17. Assuming that it is desired to reproduce at the monitor 13 source information (video information) from the camera 12 provided at the second node (10-2), the control console 17 outputs to the second node 10-2 a command for driving the transmission unit 10C of the second node 10-2.

The video information from the camera 12 transmitted, in response to this, from the second node 10-2 passes through the transmission line 11 and the receiving port (R) and sending port (S) of the third node 10-3 to reach the monitor node 10-M, is decoded at the receiving unit 10D in the monitor node 10-M, and is reproduced at the monitor 13.

Summarizing the problem to be solved by the present invention, discussed in general terms above, when expanding a point-to-point connection configuration transmission network (FIG. 19) into a point-to-multipoint connection configuration transmission network (FIG. 20 or FIG. 21), a means is required for switching channels.

If such a means for switching channels is interposed, however, the operation of switching the channel from one node (for example, 10-1) to another node (for example, 10-2) becomes necessary. The following problem arises, however, when switching a channel.

The above mentioned one node, for example, 10-1, operates by a first system clock unique to the node 10-1. The time reference clock (first time reference clock) serving as the time base for the above, to be included in the digital data transmitted from the node 10-1 to the monitor node 10-M, is produced in synchronization with the first system clock.

The above mentioned another node, for example, 10-2, operates by a second system clock unique to the node 10-2. The time reference clock (second time reference clock) serving as the time base for the above, to be included in the digital data transmitted from the node 10-2 to the monitor node 10-M, is produced in synchronization with the second system clock.

If the channel is switched from the node 10-1 to the node 10-2, the monitor node 10-M which had reproduced its own system clock in synchronization with the first time reference clock from the node 10-1, then, has to reproduce its own system clock in synchronization with the second time reference clock from the node 10-2.

Since the first system clock in the node 10-1 and the second system clock in the node 10-2 are generated independently in each node, naturally the first time reference clock and the second time reference clock become asynchronous with each other. Therefore, the monitor node 10-M which had operated by a system clock synchronized with the first time reference clock becomes out of sync with the newly received second time reference clock immediately after switching the channel from the node 10-1 to the node 10-2.

The out-of-sync monitor node 10-M then immediately starts a repull-in operation to synchronize its own system clock with the new second time reference clock. Due to this repull-in operation, however, the system clock in the monitor node 10-M ends up fluctuating.

As explained above, when such a fluctuation occurs in the system clock, a color irregularity appears in the image reproduced on the monitor 13 of the monitor node 10-M and the image ends up being degraded in quality for a certain time. This degradation of the quality of the image lasts for several seconds. In actual operation of a transmission network, however, when used successively switching images at the monitor 13 in for example 5-second intervals such as from the camera 12 of the node 10-1 to the camera 12 of the node 10-2 and on to the camera 12 of the node 10-3, the problem arises that a normal image cannot be obtained on the monitor 13 much at all. This poses a serious problem in the case of for example a multi-location television conference system where the participants in the conference are successively shown on the monitor 13 by the cameras 12 at those locations.

The present invention was made in consideration of this problem and provides a method and apparatus for reproducing a system clock in a digital data transmission network which completes the repull-in operation of the system clock at the time of channel switching in an extremely short time and thereby prevents fluctuations in the system clock from occurring. This will be explained in detail below.

Figure 1:
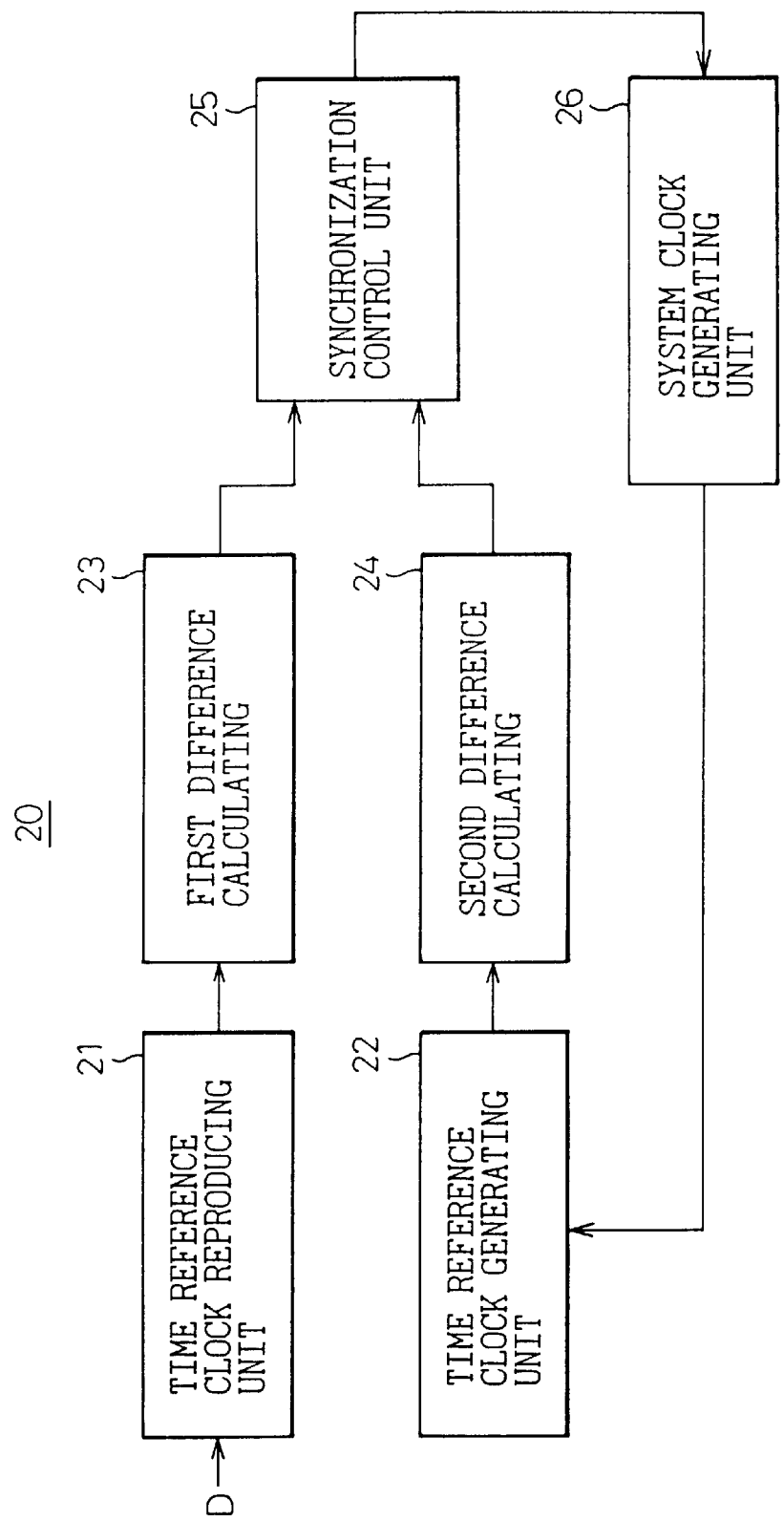
FIG. 1 is a basic block diagram of a system clock reproducing apparatus according to a first aspect of the present invention.

FIG. 1 is a basic block diagram of a system clock reproducing apparatus according to a first aspect of the present invention.

In the figure, reference numeral 20 is a system clock reproducing apparatus. The apparatus 20 is comprised of a time reference clock reproducing unit 21, a time reference clock generating unit 22, a first difference calculating means 23, a second difference calculating means 24, a synchronization control unit 25, and a system clock generating unit 26.

Among these, the components characterizing the present invention are the first and second difference calculating means 23 and 24.

The time reference clock reproducing unit 21 receives the digital data D including a first time reference clock transmitted from a sending side node and reproduces the first time reference clock at the receiving node.

The system clock generating unit 26 generates a system clock providing the operation base at the receiving node.

The time reference clock generating unit 22 receives as input the system clock from the system clock generating unit 26 and generates a second time reference clock providing the time base at the receiving node.

The synchronization control unit 25 controls the system clock generating unit 26, based on the reproduced first time reference clock and the generated second time reference clock, so as to minimize the deviation between these clocks.

Further added to the system clock reproducing apparatus 20 are the first and second difference calculating means 23 and 24.

The first difference calculating means 23 calculates the difference between adjoining counts of the first time reference clock at a receiving time interval.

The second difference calculating means 24 calculates the difference between adjoining counts of the second time reference clock at the receiving time interval.

Here, the outputs from the first and second difference calculating means 23 and 24 are input to the synchronization control unit 25 to minimize the deviation between the external and internal reference clocks. When the two clocks have minimized, the system clock of the apparatus 20 is synchronized with the received first time reference clock and the reproduction of the system clock is ended.

The thus reproduced system clock is obtained without going through a repull-in operation of the system clock at the time of channel switching, so there is no longer any fluctuation of the system clock and a high quality image not accompanied with color irregularity of the image is obtained. Note that in the present invention, the explanation was given taking as an example video information (video packet) as the source information, but of course the effect of the present invention is obtained as well in the case of other media, for example, audio information (audio packet) as the source information. The mode of operation of the present invention giving this effect will be explained later.

Figure 2:
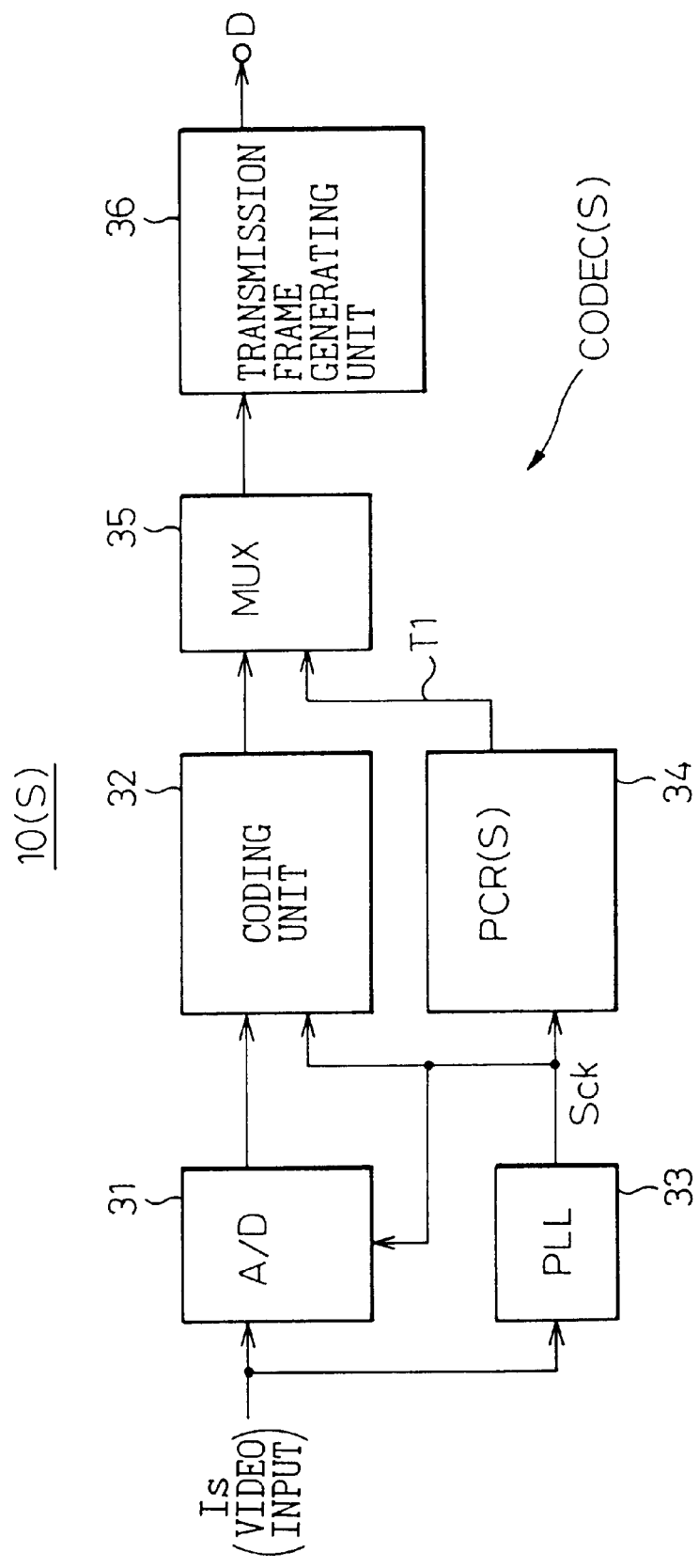
FIG. 2 is a view of an example of the configuration of a coding side (S) of a node to which the present invention is applied.

FIG. 2 is a view of an example of the configuration of a coding side (S) of a node to which the present invention is applied.

The following explanation will be made taking as an example a node, as the node 10, comprised of a digital coding/decoding apparatus (CODEC) using MPEG2 coding/decoding technology as the node 10.

In FIG. 2, the coding side (CODER) S (shown as (10(S))) of the CODEC constituting the node 10 receives the source information Is, for example, video input from a camera 12, codes the input, and sends it as the digital data D to the transmission line 11.

The video input (Is) is first converted at the A/D converter 31 to a digital signal and then coded at the coding unit 32.

The system clock Sck serving as the time base in the node 10(S) is extracted from the video input of the analog signal through the PLL circuit 33 and given to the above A/D converter 31 and the coding unit 32 etc.

The system clock Sck is input to a PCR generating unit 34. This PCR generating unit 34 performs a similar function as with the above-mentioned time reference clock generating unit 22 and generates the above-mentioned first time reference clock T1. "PCR" is an abbreviation for "program clock reference" defined in MPEG2.

The generated first time reference clock T1 is multiplexed with the digital signal of the audio input from the coding unit 32 at the multiplexing unit (MUX) 35 and composed into a predetermined frame format at a transmission frame generating unit 36 to form the digital data D.

Figure 3:
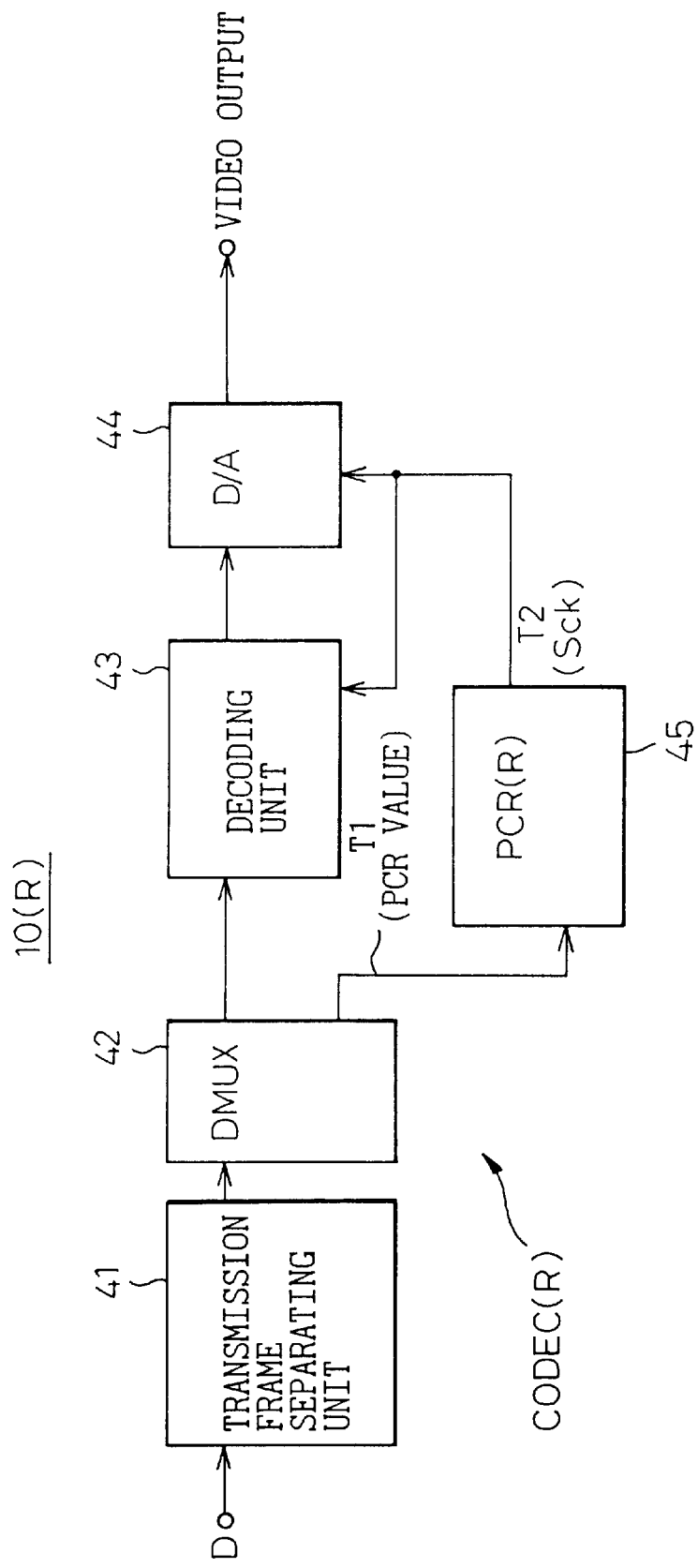
FIG. 3 is a view of an example of the configuration of a decoding side (R) of a node to which the present invention is applied.

FIG. 3 is a view of an example of the configuration of the decoding side (R) of a node to which the present invention is applied.

In the figure, the decoding side (DECODER) R (shown as 10(R)) of the CODEC constituting the node 10 receives the digital data D from the transmission line 11 at a transmission frame separating unit 41 and decomposes it into digital data of the individual frames.

The digital data of each frame is demultiplexed at the demultiplexing unit (DMUX) 42 into the original video input and the PCR value. The PCR value is the count of the first time reference clock T1, that is, PCR, in any time interval determined by the MPEG2, for example, a 100 ms time interval.

The demultiplexed video input is supplied to the decoding unit 43 where the video input portion of the coded digital data is decoded. Further, this is converted into the video output of an analog signal at the D/A converter 44 and reproduced as the original image at the monitor 13.

The system clock Sck serving as the time base in the node 10(R) is obtained at the PCR reproducing unit 45 as the system clock Sck at the node (R) synchronized with the above extracted PCR value (first time reference clock T1). The system clock Sck is a clock for generating the second time reference clock T2 of the node 10. The PCR reproducing unit 45 corresponds to the previously mentioned time reference clock reproducing unit 21. Note that the previous mentioned system clock generating unit 26, which is inseparable in relation with the PCR reproducing unit 45, will be explained in detail later.

Figure 4:
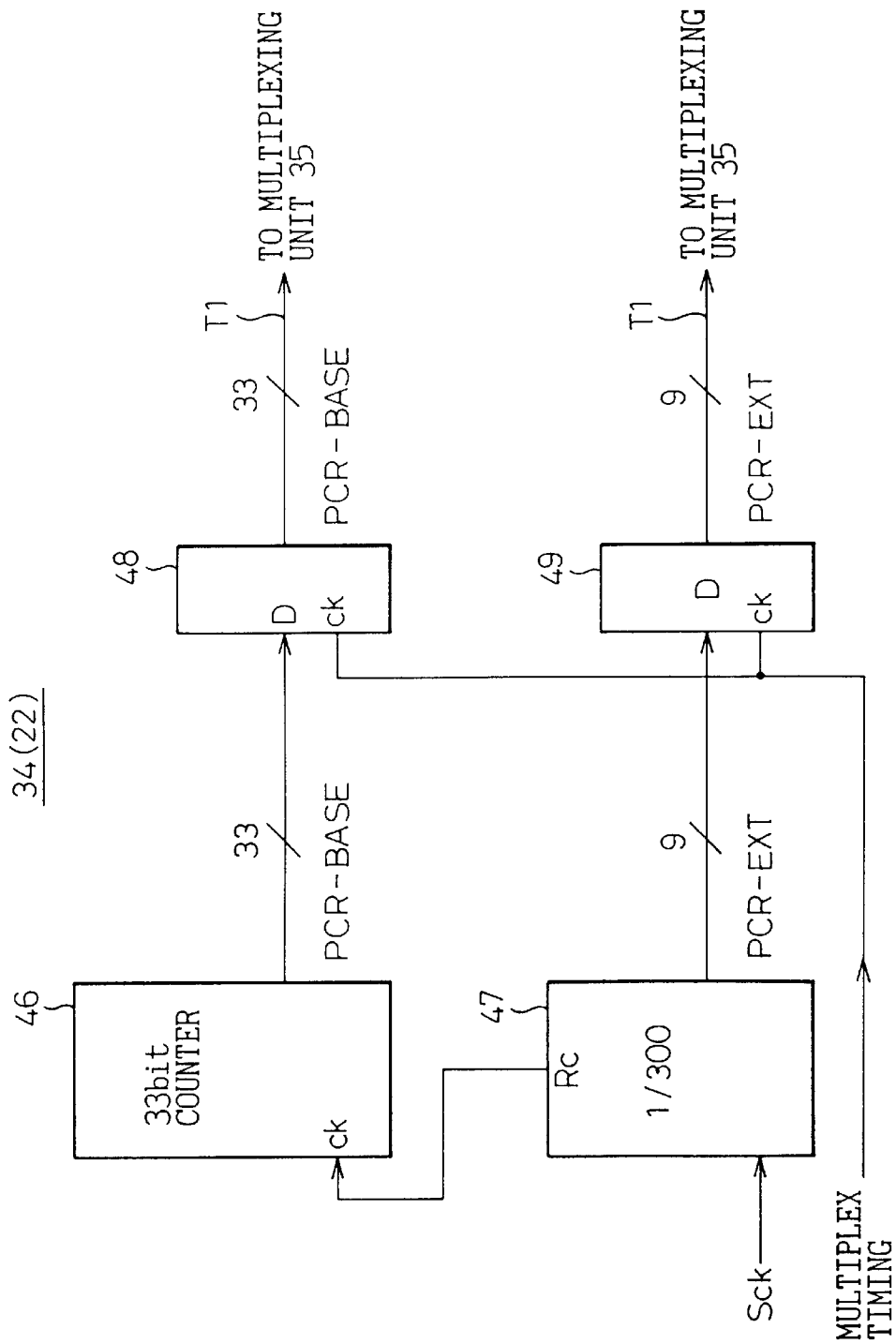
FIG. 4 is a view of a specific configuration of a PCR generating unit 34 shown in FIG. 2.

FIG. 4 is a view of the specific configuration of the PCR generating unit 34 shown in FIG. 2.

In the figure, first the system clock Sck from the PLL circuit 33 (FIG. 2) is divided by the 1/300 dividing circuit 47 based on the recommendations of the MPEG2 to obtain the 9-bit count PCR-EXT and increments the 33-bit counter 46 by the 90 kHz signal obtained by dividing the system clock Sck (27 MHz under MPEG2) to obtain the 33-bit count PCR-BASE.

These counts are set in the D-FF 48 and the D-FF 49 at the multiplex timing and input to the multiplexing unit 35 (FIG. 2). The 42- (=33+9) bit count "PCR-BASE"+"PCR-EXT") is multiplexed with the digital data D at the multiplex timing. The previous mentioned "any time interval", is defined by this multiplex timing. The count obtained at this any time interval becomes the above-mentioned first time reference code T1.

Figure 5:
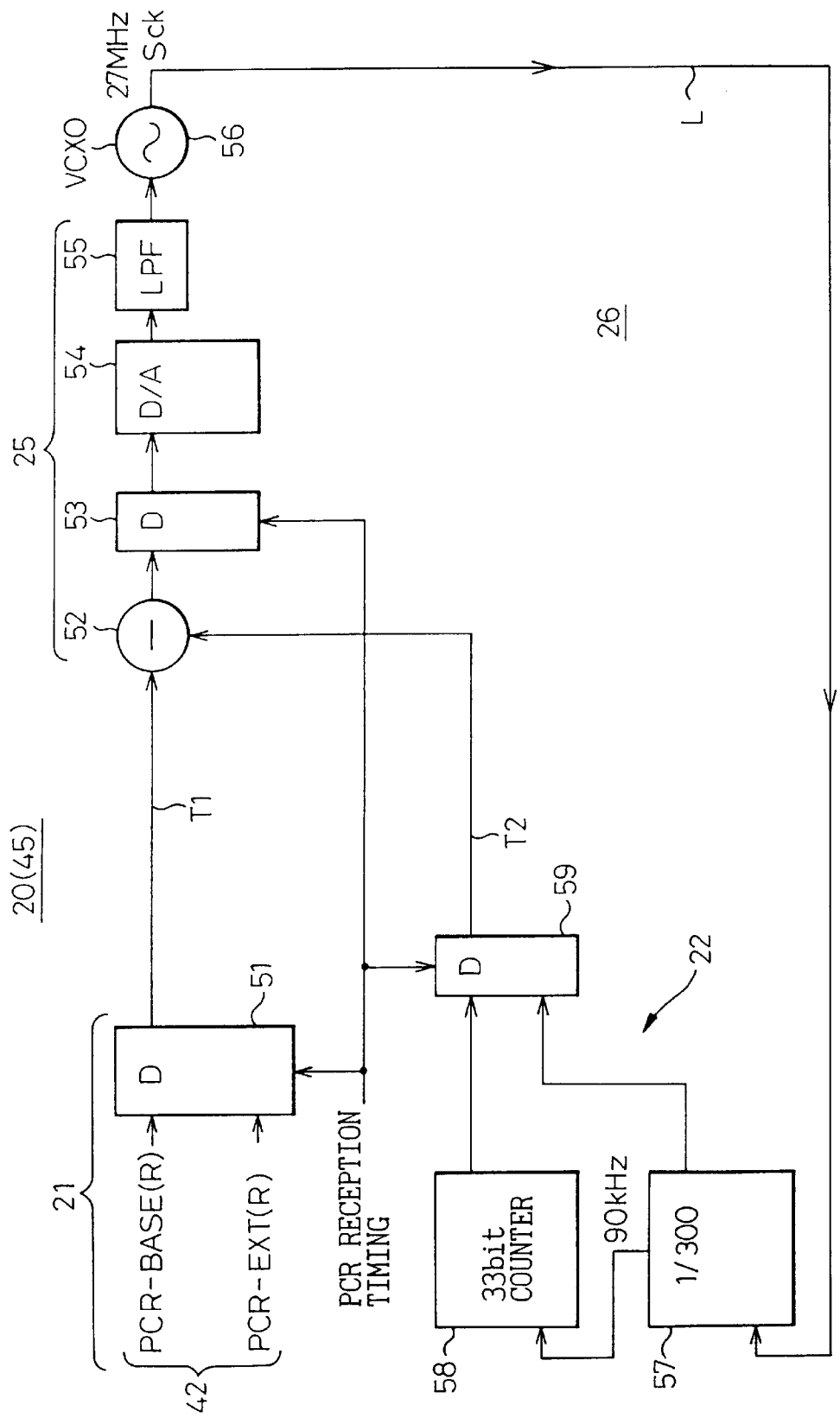
FIG. 5 is a more detailed view of a PCR reproducing unit 45 in FIG. 3.

FIG. 5 is a more detailed view of the PCR reproducing unit 45 in FIG. 3. This PCR reproducing unit 45 corresponds to the system clock reproducing apparatus 20 shown in FIG. 1.

In the figure, the time reference clock reproducing unit 21 corresponds to both a part of the separating unit 42 and the D-FF 51 and reproduces the first time reference clock T1 from the sending node.

Further, the above-mentioned synchronization control unit 25, as illustrated, is comprised of a subtractor 52, a D-FF 53, a D/A converter 54, and a low-pass filter (LPF) 55.

Further, the above-mentioned system clock generating unit 26 is comprised of both a voltage-controlled oscillator (VCXO) 56 outputting the system clock Sck (27 MHz) at the receiving node and a closed loop L from the VCXO 56 to the subtractor 52. The above-mentioned time reference clock generating unit 22 is inserted in part of the closed loop L. The clock generating unit 22 is comprised of a 1/300 dividing circuit 57, 33-bit counter 58, and D-FF 59 and generates a time reference clock (above-mentioned second time reference clock T2) at the receiving node.

The subtractor 52 receives as input the first time reference clock (PCR value) T1 reproduced from the digital data D received from the sending side and the second time reference clock (PCR value) T2 generated at the receiving side and compares them to obtain the difference between the two. Note that the clock T1 is fetched and the clock T2 is generated both at the PCR receiving timing corresponding to the above-mentioned "any time interval" (for example, 100 ms). Further, the above difference (T1–T2) is set from the subtractor 52 in the D-FF 53 at this any time interval. The set difference is digital, converted to an analog signal by the D/A converter 54, and applied through the low pass filter 55 to the voltage-controlled oscillator 56 for control of its oscillation frequency. This control is performed so as to make the difference, that is, the deviation between the clock T1 and the clock T2, converge so in the end the system clock Sck of the receiving side node (Sck of FIG. 5) is locked into the clock T1 received from the sending side node.

The above-explained configuration and operation according to the present invention are common with those of the system clock reproducing apparatus of the related art and are the same as the configuration and operation in the case of the absence of the first and second difference calculating means 23 and 24 in FIG. 1.

If the system clock generating apparatus 20 of the configuration shown in FIG. 5 is used, the problem occurs of degradation (color irregularity) of the quality of the image at the time of switching channels between the sending side nodes (10). This will be explained with reference to the drawings.

Figure 6:
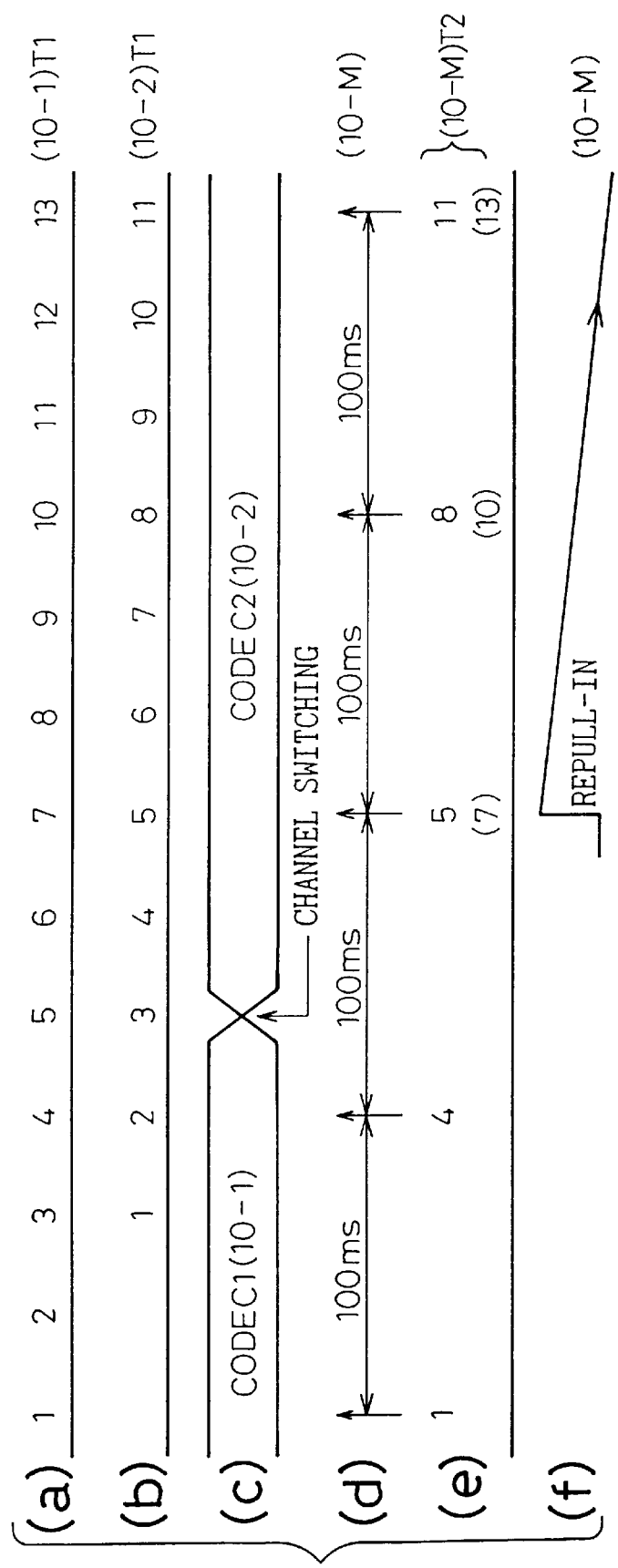
FIG. 6 is a time chart for explaining the problem of the related art at the time of channel switching.

FIG. 6 is a time chart for explaining this problem at the time of channel switching in the related art.

In the figure, (a) shows the above-mentioned PCR value at the first node 10-1 (10-1 in FIG. 21) of the sending side, that is, the first time reference clock T1 and (b) shows the identical first time reference clock T1 at the second node 10-2 (10-2 in FIG. 21) of the sending side. Since the node 10-1 and the node 10-2 are not synchronized, the two clocks T1 (PCR values) do not coincide.

(c) shows the state of the channel switching, at a certain time, causing the sending side node to switch from the first node 10-1 (CODEC 1) to the second node 102 (CODEC 2).

(d) shows the above-mentioned "any time interval", for example, 100 ms. The upward arrows correspond to the "PCR receiving timing" shown in FIG. 5. This PCR receiving timing is generated at the receiving side monitor node 10-M of FIG. 21.

(e) shows the PCR value (first time reference clock T1) extracted at the monitor node 10-M at this any time interval. The second time reference clock T2 generated in the monitor node 10-M is pulled in to this PCR value (first time reference clock T1).

(f) shows that the clock is repulled in several seconds after the above channel switching. This repull-in operation causes the color irregularity of the image as explained above.

Referring to the (e) here once again, at the receiving side monitor node 10-M where the system clock is reproduced, while the clock T1, extracted from the received digital data D, should be changed by constant increments in the manner of 1→4→7→10→13, the channel switching shown at (c) causes this to become 1→4→5→8→11. Due to this, the system clock reproducing apparatus 20 (FIG. 5) in the node 10-M starts a repull-in operation. So long as this repull-in operation is performed, it is not possible to avoid the above-mentioned color irregularity of the image.

Figure 7:
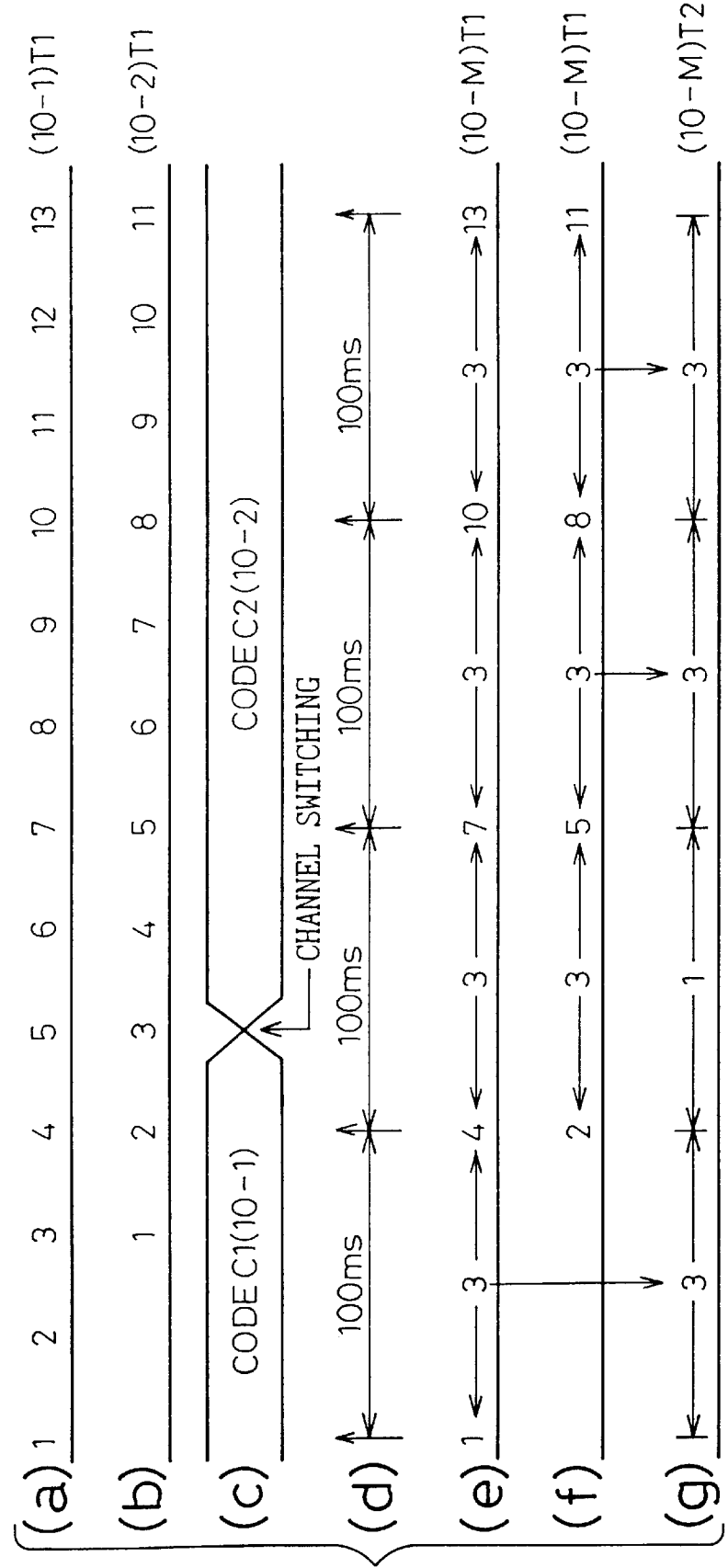
FIG. 7 is a time chart for explaining the operation based on the present invention.

FIG. 7 is a time chart for explaining the operation according to the present invention. (a) to (d) are the same as in the case of FIG. 6.

The present invention is based on the idea of reproducing the system clock by relative values. The "relative values" have two meanings: the (1) meaning of the relative values of the clock T1 at each node among the first node, second node, third node . . . and the (2) meaning of the relative values of the clocks (T1 and T2) between the first node and the monitor node, the relative values of the clocks (T1 and T2) between the second node and the monitor node, and the relative values of the clocks (T1 and T2) between the third node and the monitor node. The time chart of FIG. 7 is based on the latter case (2). The former case (1) will be explained later.

(e) of FIG. 7 shows the difference (increment) of the PCR values between adjoining clocks T1 of the sending side node 10-1 to be extracted at the receiving side monitor node 10-M assuming no channel switching. The difference is for example 3.

(f) of FIG. 7 shows the difference (increment) of the PCR values between adjoining clocks T1 of the sending side node 10-2 to be extracted at the receiving side monitor node 10-M assuming no channel switching. The difference is for example 3. The difference is kept at 3 since the fluctuation in the system clock Sck at the first node 10-1 is less than 27 MHz±30 ppm and the fluctuation in the system clock Sck at the second node 10-2 is less than 27 MHz±30 ppm as well—extremely slight values.

This being the case, at (g) of FIG. 7, the difference in the PCR values between adjoining clocks T2 in the monitor 10-M also becomes for example 3. Looking at the change in this difference 3 at (g), it is first 3, but since there is channel switching in the next 100 ms interval, the result is not 3→3, but 3→1. While the PCR value of the clock T1 at (e) should become 7, the channel switching results in a change in the PCR value of the clock T1 of (f) to 5 (7→5).

What should be noted here, however, is that while the difference of the clock T2 is disturbed, at (g), immediately after channel switching, that is, 3→1, after this the original difference is returned to once again and a constant value (3) is maintained, that is, 3→3→. . . That is, the system clock reproducing apparatus 20 (FIG. 5) in the monitor node 10-M is disturbed in synchronization for an instant due to the channel switching, but then immediately returns to the original synchronization state, so there is no repull-in operation as shown in (f) of FIG. 6. Therefore, no color irregularity occurs in the image.

Based on the idea of reproducing a system clock by relative values in the present invention explained above, the first difference calculating means 23 and the second difference calculating means 24 shown in FIG. 1 are introduced.

The operation of the system clock reproducing apparatus 20 shown in FIG. 1 includes the following steps:

Step S11: The apparatus receives the digital data D containing the first time reference clock T1 sent from the sending side node (for example, 10-1) and reproduces the first time reference clock T1 by the time reference clock reproducing unit 21 of the receiving side node (for example, 10-M).

Step S12: The apparatus generates the system clock Sck serving as the operation base by the system clock generating unit 26 at the receiving side node 10-M.

Step S13: The apparatus generates a second time reference clock serving as the time base in synchronization with the system clock Sck by the time reference clock generating unit 22 at the receiving side node 10-M.

Step S14: The apparatus calculates a first difference between adjoining counts (PCR values) of the first time reference clock in any time interval (for example, 100 ms) by the first difference calculating means 23.

Step S15: The apparatus calculates the second difference between adjoining counts (PCR values) of the. second time reference clock T2 in any time interval by the second difference calculating means 24.

Step S16: The apparatus makes, based on the reproduced first time reference clock T1 and the generated second time reference clock T2, the deviation between these clocks converge by the synchronization control unit 25 and the system clock generating unit 26.

Figure 8:
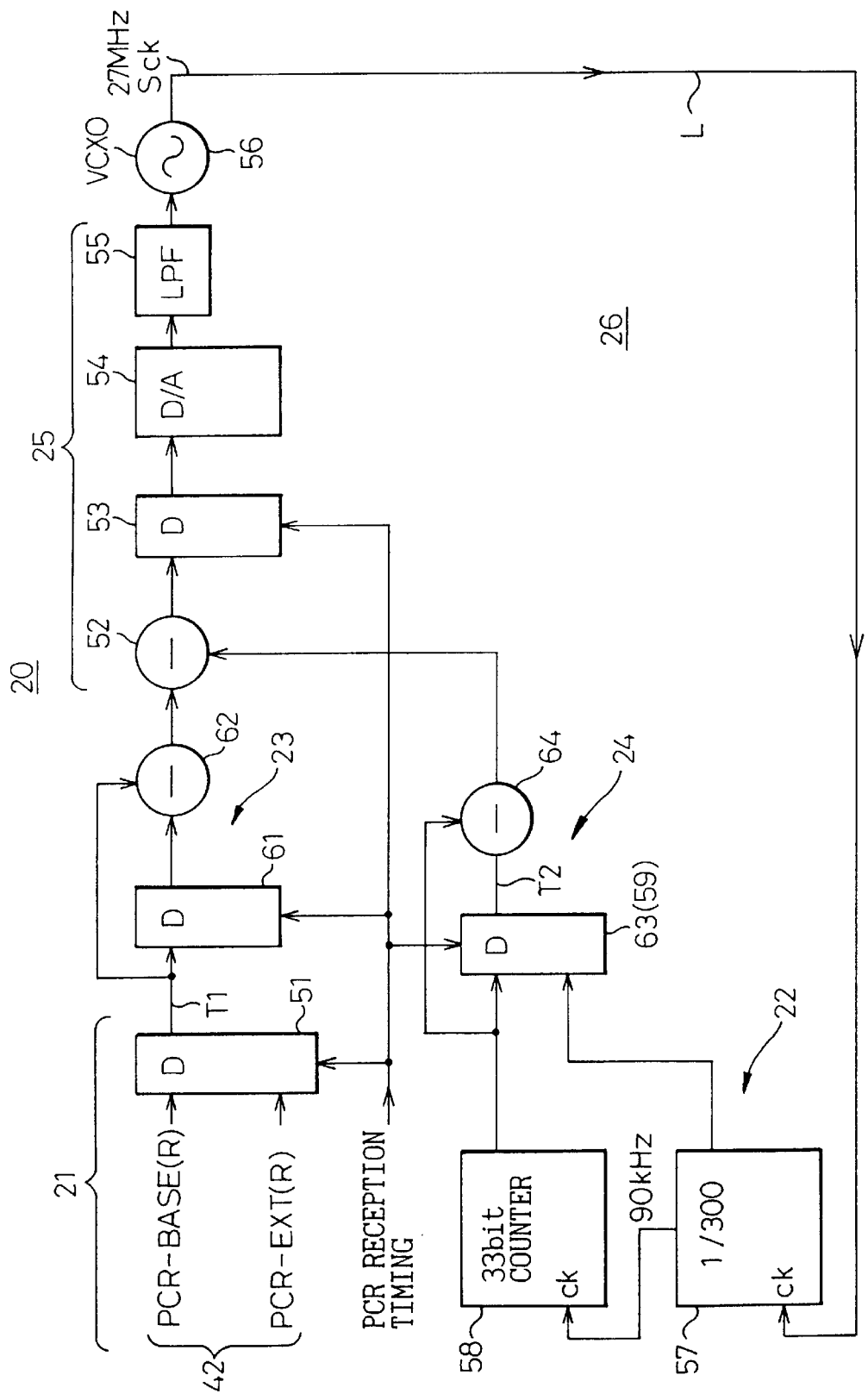
FIG. 8 is a view of a system clock reproducing apparatus according to a first embodiment of the present invention.

FIG. 8 is a view of a system clock reproducing apparatus according to a first embodiment of the present invention.

In the figure, the first difference calculating means 23 is comprised of a first delay circuit 61 which receives as input the first time reference clock T1 and a first subtracting circuit 62 which receives as input both the first time reference clock T1 of the input side of the first delay circuit 61 and the first time reference clock T1 of the output side of the first delay circuit 61 and obtains the difference between the two. The above-mentioned relative value of the clocks T1 is obtained by this first subtracting circuit 62.

The second difference calculating means 24 is comprised of a second delay circuit 63 which receives as input the second time reference clock T2 and a second subtracting circuit 64 which receives as input both the second time reference clock T2 of the input side of the second delay circuit 63 and the second time reference clock T2 of the output side of the second delay circuit 63 and obtains the difference between the two. The above-mentioned relative value of the clocks T2 is obtained by this second subtracting circuit 64. Note that an example is shown of common use of the D-FF 59 shown in FIG. 5 as the second delay circuit 63 shown in the figure. Further, in FIG. 8, all of the components other than the above (61, 62, 63, and 64) are exactly the same as the corresponding parts of FIG. 5.

Therefore, according to the system clock reproducing apparatus of FIG. 8, the synchronization is disturbed for an instant right after channel switching (see "1" of (g) of the above FIG. 7) only and it then becomes possible to stably reproduce the system clock at the monitor node 10-M. This is because there is no accompanying repull-in operation.

Figure 9:
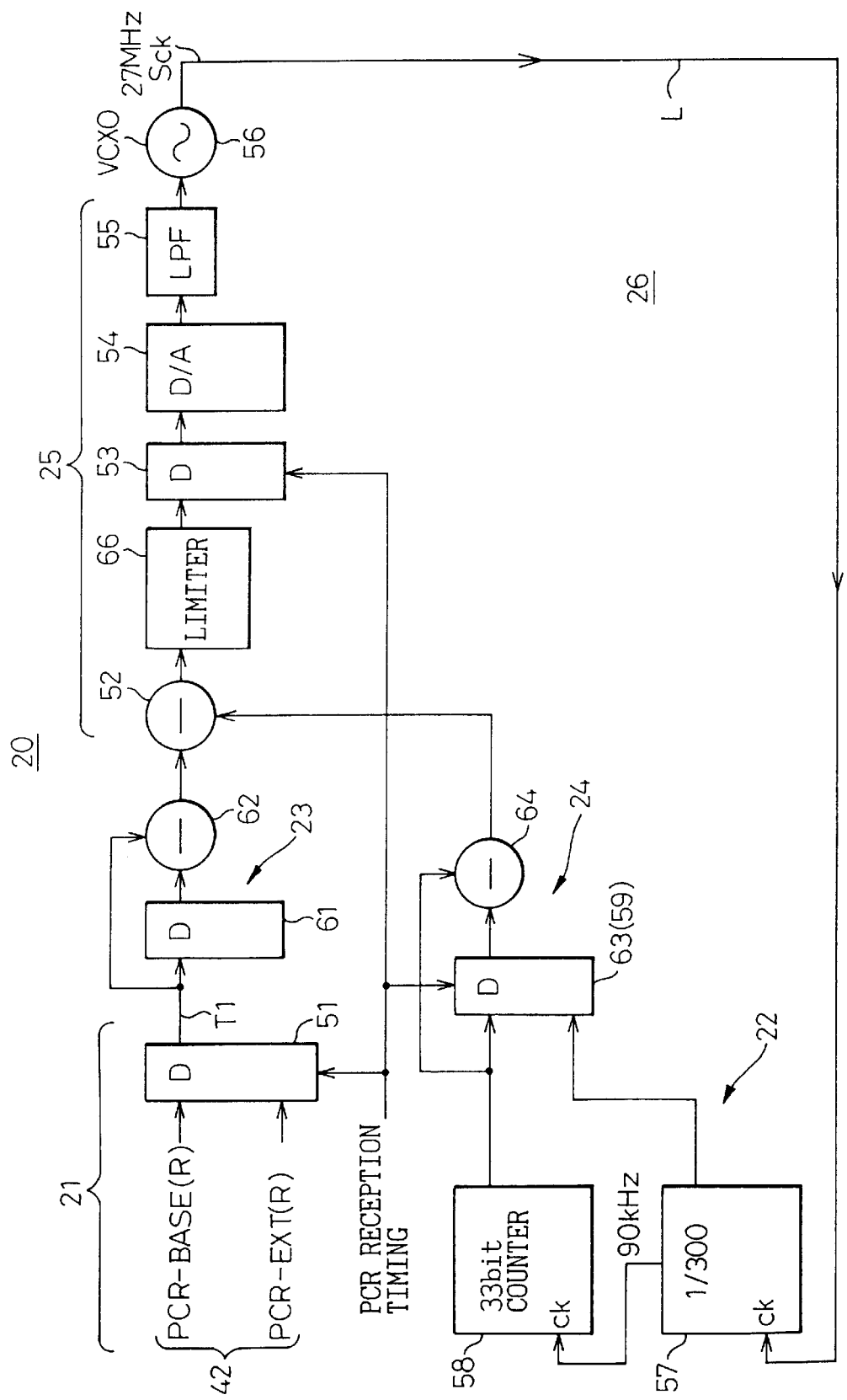
FIG. 9 is a view of a system clock reproducing apparatus according to a second embodiment of the present invention.

FIG. 9 is a view of a system clock reproducing apparatus according to a second embodiment of the present invention.

In the figure, a difference in operation from the first embodiment (FIG. 8) is that there is a step of monitoring an error between the first difference obtained by the already explained fourth step S14 and the second difference obtained by the already explained step S15 and temporarily stopping the convergence operations by step S16 when that error exceeds an allowable error.

The instant disturbance of synchronization shown at (g) of FIG. 7 naturally causes a fluctuation in the system clock. If it were possible to reduce even this slight fluctuation, the system clock could be stably maintained against channel switching.

Therefore, the operations of the synchronization control unit 25 and system clock generating unit 26 are made to be temporarily stopped when the above error between the differences exceeds an allowable error.

Specifically, in FIG. 9, further provision is made of a limiter 66 which monitors an error between the first difference from the first difference calculating means 23 and the second difference from the second difference calculating means 24 and temporarily stops the control by the synchronization unit 25 when that error exceeds an allowable error.

As explained above, the fluctuation of the system clock Sck, that is, the fluctuation in the frequency of the clock T1, is normally suppressed to ±30 ppm. Therefore, by giving a threshold of for example ±50 ppm to the limiter 66 and detecting a fluctuation in the clock T1 exceeding that threshold by the limiter 66, the output of the limiter can be immediately fixed. The limiter 66 may be realized by for example a decoder. The fluctuation in the clock T1 accompanying channel switching reaches as high as ±10,000 ppm, so the limiter 66 can easily detect abnormalities.

Figure 10:
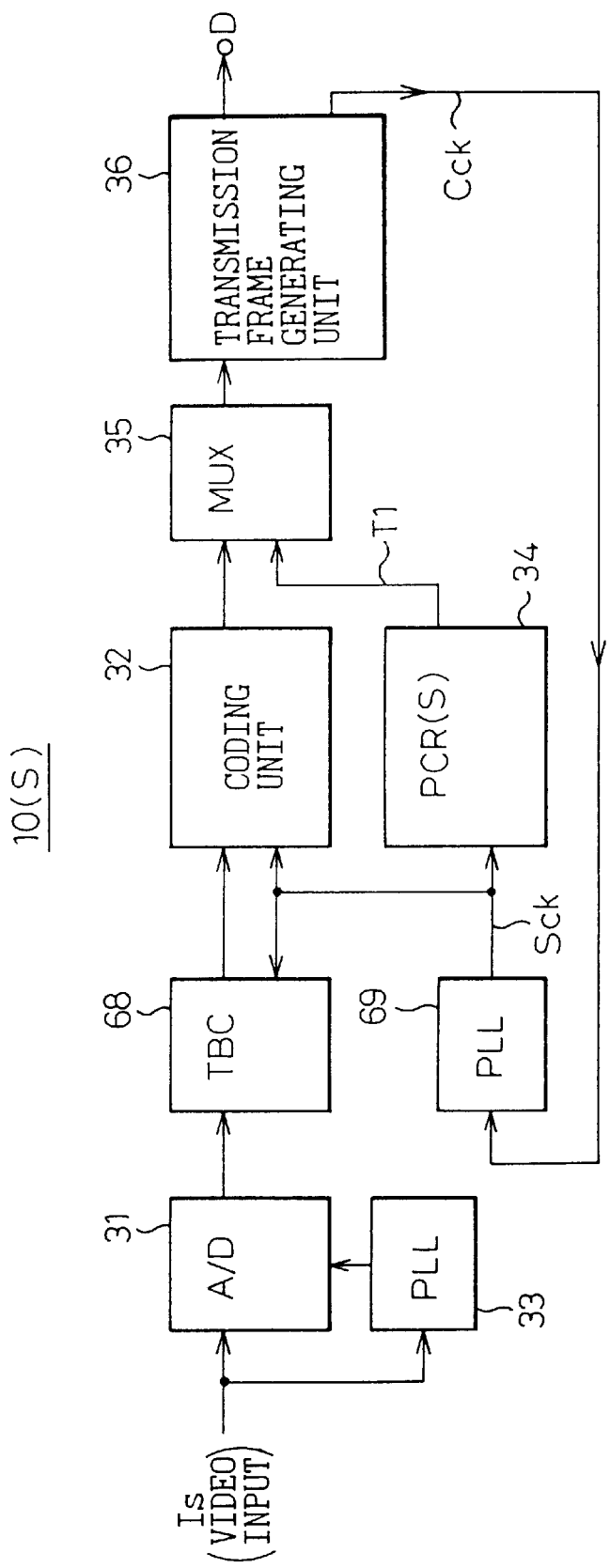
FIG. 10 is a view of a system clock reproducing apparatus according to a third embodiment of the present invention.

FIG. 10 is a view of a third embodiment of the present invention. The third embodiment does not directly modify the system clock reproducing apparatus at the receiving side node (10-M), but suppresses the fluctuation of the system clock at the receiving side node indirectly by modifying the sending side nodes (10-1, 10-2 . . . ).

That is, it gives a known time base correct (TBC) function to the sending side node and causes the system clock serving as the operation base at the sending side node to be synchronized with a channel clock Cck for sending digital data on to the channel from the sending side node.

Referring again to FIG. 2, the sending side (coding side) node 10(S) generates the system clock Sck in the node 10(S) based on a clock detected by the PLL circuit 33 from source information from a camera 12 belonging to that node 10(S).

The same is true for the other sending side nodes 10(S). Note however that the cameras 12 belonging to the different sending side nodes 10(S) are not synchronized with each other. Therefore, the sending side nodes operate completely asynchronously from each other.

This being the case, there is a deviation in timing between the clock T1 shown in (a) of FIG. 6 and FIG. 7 and the clock T1 shown in (b) of FIG. 6 and FIG. 7. The receiving side node 10-M switches input from the clock T1 shown in (a) of FIG. 6 and FIG. 7 to the clock T1 shown in (b) of FIG. 6 and FIG. 7 at the time of channel switching. In addition to the large change in the PCR values as shown by 1, 2, 3 . . . , a clock T1 including this deviation in timing, differing for each node, is therefore received as input. Accordingly, if it were possible to eliminate this node-differing deviation in timing in advance, then the fluctuation of the system clock could be even more effectively suppressed.

The third embodiment of FIG. 10 can eliminate the above deviation in timing between sending side nodes. The basic configuration in the figure is similar to the configuration shown in FIG. 2, but in the configuration of FIG. 10, the time base corrector (TBC) 68 and the PLL circuit 69 are further provided.

In the third embodiment, a channel clock Cck identical to the channel clock on the transmission line 11 is extracted by the transmission frame generating unit 36. This goes through the PLL circuit 69 to obtain the system clock Sck. This system clock Sck is used to control the time base corrector 68. The time base corrector 68 functions to suitably discard the image frames from the camera 12 and slaves the digital video signal to the channel clock Cck.

In this way, the third embodiment is characterized in that the sending side node generates a system clock Sck forming the operation base at the sending side node in synchronization with the channel clock Cck for sending the digital data D from the sending side node to the channel and provides a time base corrector (TBC) 68 for operating in synchronization with the system clock Sck.

The time base corrector 68 itself is a known one which synchronizes video signals between cameras when there are several cameras, but will be explained in brief below.

Figure 11:
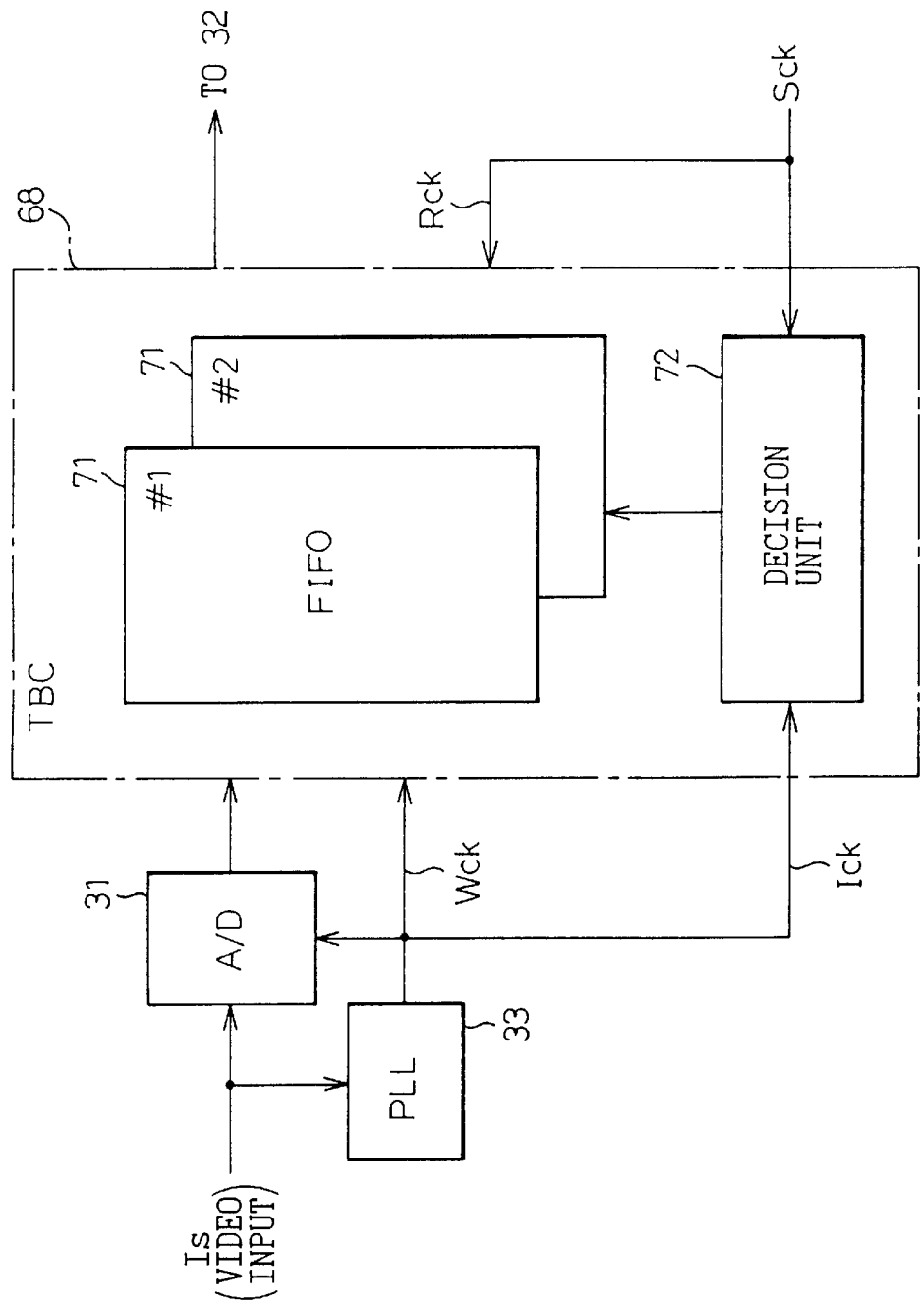
FIG. 11 is a view for simply explaining a time base corrector 68.

FIG. 11 is a view briefly explaining the time base corrector 68.

As shown in the figure, the time base corrector (TBC) 68 is comprised of two FIFOs 71 (#1 and #2) and a decision unit 72. The two FIFOs usually have the capacity to store one frame's (one picture's) worth of information.

The source information (video input) Is from a camera 12 is converted to a digital signal by the A/D converter 31 by the clock extracted using the PLL circuit 33 from the source information Is and is input to the time base corrector 68.

The two FIFOs 71 in the time base corrector 68 are alternately switched between for use for writing the digital signal (by write clock Wck) and for reading (by read clock Rck).

The decision unit 72 is provided for enabling such alternating write and read operations to be performed in synchronization with the system clock Sck. The decision unit 72 receives as input the system clock Sck and the clock Ick of the source information Is serving as the video input and determines the write and read timing of the FIFOs 71 based on the deviation in timing between the two.

The write operation to an FIFO is always performed alternately in the order of #1→#2→#1→.

If the write operation starts to lead the read operation slightly, one frame is skipped in the read operation.

Further, if the write operation starts to fall behind the read operation slightly, the same frame is read twice.

Therefore, a digital signal synchronized with the channel clock Cck is input to the coding unit 32.

Figure 12:
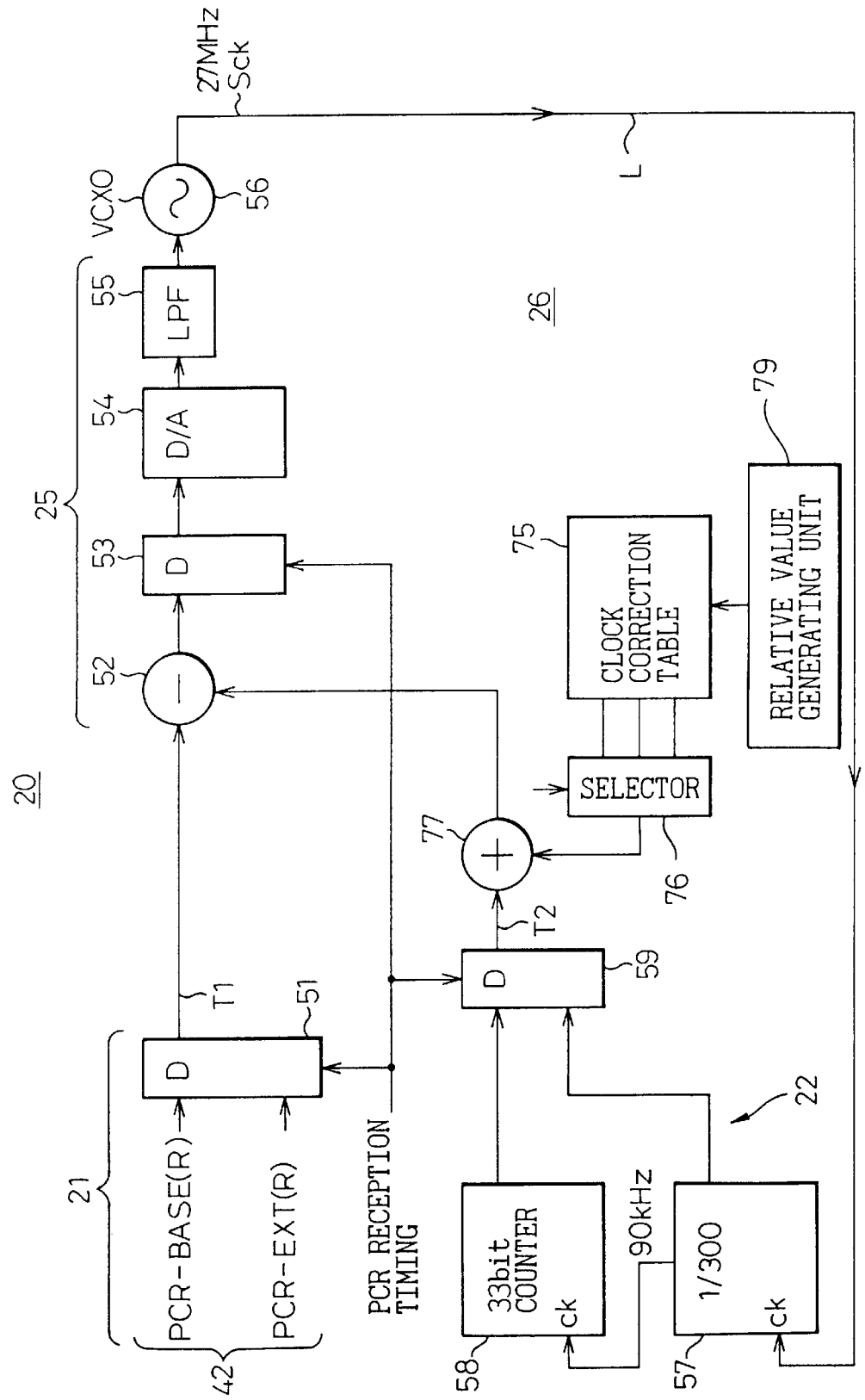
FIG. 12 is a view of a system clock reproducing apparatus according to a fourth embodiment based on a second aspect of the present invention.

FIG. 12 is a view of a system clock reproducing apparatus of a fourth embodiment based on the second aspect of the present invention.

In the figure, the fourth embodiment (second aspect) is characterized by a time reference clock correction table 75 and adding unit 77 provided inside the monitor node 10-M. A selector 76 receives designation information from the outside, selectively reads clock correction information in the correction table 75 corresponding to the sending side node (10-1, 10-2 . . . 10-N) to start sending source information Is from then, and gives the same to one input of the adding unit 77. The original second time reference clock T2 (PCR value) is supplied to the other input of the adding unit 77.

The time reference clock correction table 75 receives digital data D selectively sent from the N (N=2, 3. . . ) number of sending side nodes (10-1, 10-2 . . . 10-N), finds the relative values between the first time reference clocks T1 of the sending side nodes reproduced by the time reference clock reproducing unit 21, and holds the results in correspondence with the sending side nodes.

The adding unit 77 reads the relative value corresponding to a sending side node sending the received digital data D from the time reference clock correction table 75 and adds it to the second time reference clock T2 from the time reference clock generating unit 22.

Preferably, further provision is made of a relative value generating unit 79 for generating the relative value to be held in the time reference clock correction table 75.

Figure 13:
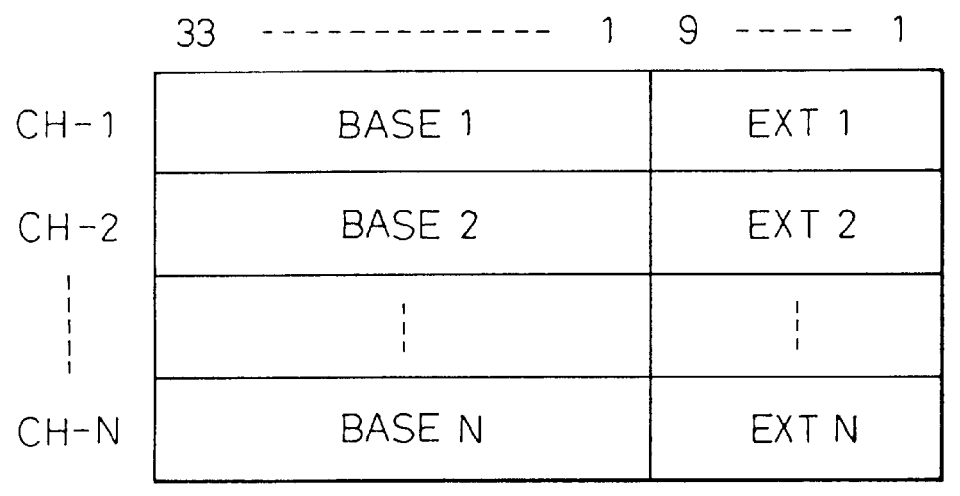

FIG. 13 is a view of an example of the format of the time reference clock correction table 75 shown in FIG. 12. This correction table 75 stores, by dividing the time reference clocks in the form of the PCR values into the PCR-BASE (33 bit) and PCR-EXT (9 bit) shown in FIG. 4 the time reference clocks in correspondence with the channels (CH-1, CH-2 . . . CH-N), that is, in correspondence with the sending side nodes.

In the above first aspect of the invention, the deviation between a sending side node and a receiving side node was absorbed in the form of a difference of the clock T1 and a difference of the clock T2. In the second aspect (fourth embodiment), the deviation in relative values between sending side nodes is absorbed individually at the receiving side node.

Therefore, the system clock reproducing apparatus 20 shown in FIG. 12 operates based on the following steps:

Step S21: The apparatus receives the digital data D including the first time reference clock T1 sent selectively from the N (N=2, 3 . . . ) number of sending side nodes (10-1, 10-2 . . . 10-N) and reproduces the first time reference clock T1 at the receiving node (10-M).

Step S22: The apparatus generates the system clock Sck serving as the operation base at the receiving side node (10-M).

Step S23: The apparatus generates the second time reference clock T2 serving as the time base at the receiving node (10-M) in synchronization with the system clock Sck.

Step S24: The apparatus finds the relative value between the first time reference clocks T1 for each sending side node reproduced by receiving the sent digital data D and stores the same in the correction table 75 for each sending side node.

Step S25: The apparatus reads the relative value corresponding to the sending side node sending the received digital data D from the correction table 75 and adds it to the generated second time reference clock T2 at the adding unit 77.

More specifically, at step S24, the count of the first time reference clock for the sending side node originating the first received digital data D is made a reference value, for example, 0, then the difference between each of the counts of the first time reference clocks T1 of the sending side nodes successively receiving it and the above reference value is made the relative value for each of the sending side nodes.

Further, an actually used relative value (PCR value) to be stored in the correction table 75 is obtained by finding, assuming the originating sending side node receiving the digital data D first as a reference node, the relative value each time digital data D is received from another node, totaling the K number of relative values (K=2, 3, 4 . . . ) found, and dividing it by K to obtain an average. This is so as to eliminate variations.

Next, an explanation will be given of a fifth embodiment according to the present invention.

Figure 14:
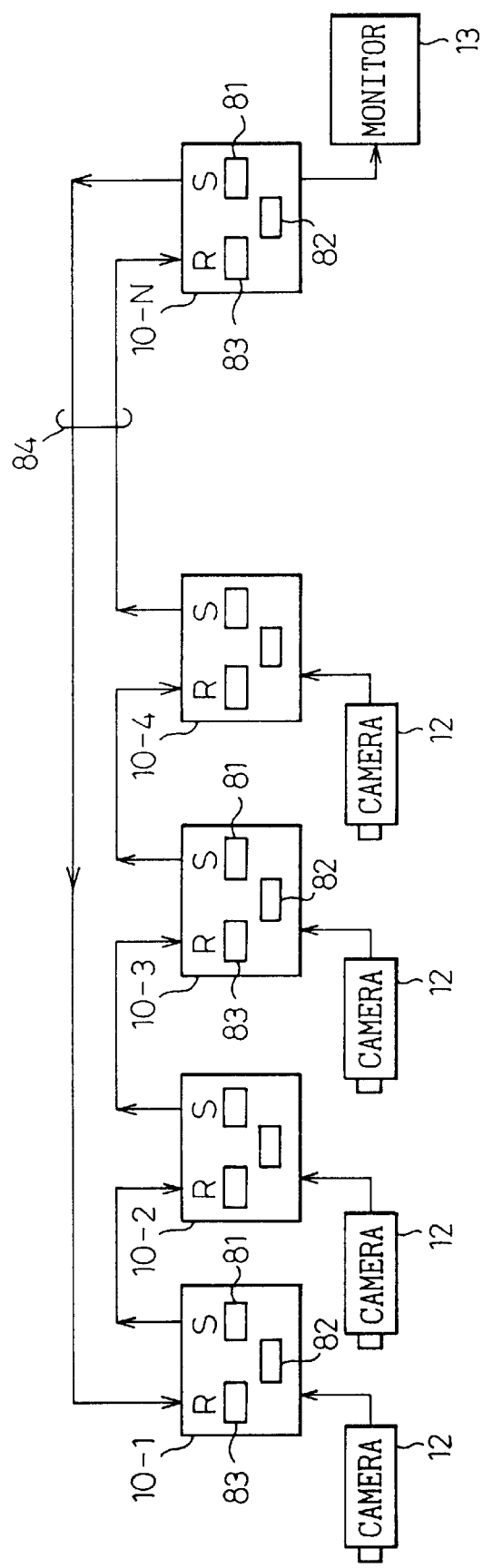
FIG. 14 is a view of a transmission network to which a fifth embodiment of the present invention may be suitably applied.

FIG. 14 is a view of a transmission network for which the fifth embodiment of the present invention may be suitably used.

In the figure, a plurality of sending side nodes (10-1, 10-2 . . . ) each having a camera 12 are inserted together with the receiving side node 10-N having a monitor 13 in a ring transmission line 84.

The sending side nodes are each provided with a receiving unit 81 for commonly receiving the digital data Dr containing the second time reference clock T2 sent through the ring transmission line 84 from the receiving side node, a time reference clock reproducing unit 82 for reproducing the second time reference clock T2 from the digital data Dr obtained from the receiving unit 81, and a sending side system clock generating unit 83 for generating a system clock serving as the operation base at the sending side node in synchronization with the second time reference clock T2 reproduced.

Note that the receiving side node 10-N having the monitor 13 is also provided with the receiving unit 81, a time reference clock reproducing unit 82, and a sending side system clock generating unit 83.

In FIG. 14, only one node (for example, 10-1) to send video information multiplexes the sent digital data Ds at a time slot of the same channel and sends it to the receiving side node 10-N. At that time, the other nodes (nodes other than 10-1 and 10-N) retransmit the received digital data Dr as it is to the channel.

The fifth embodiment eliminates the deviation in clocks T1 between sending side nodes by providing a time reference clock T2 (PCR value) from the receiving side node 10-N having the monitor 13 to all of the sending side nodes (10-1, 10-2 . . . ) in common through the ring transmission line 84.

Figure 15:
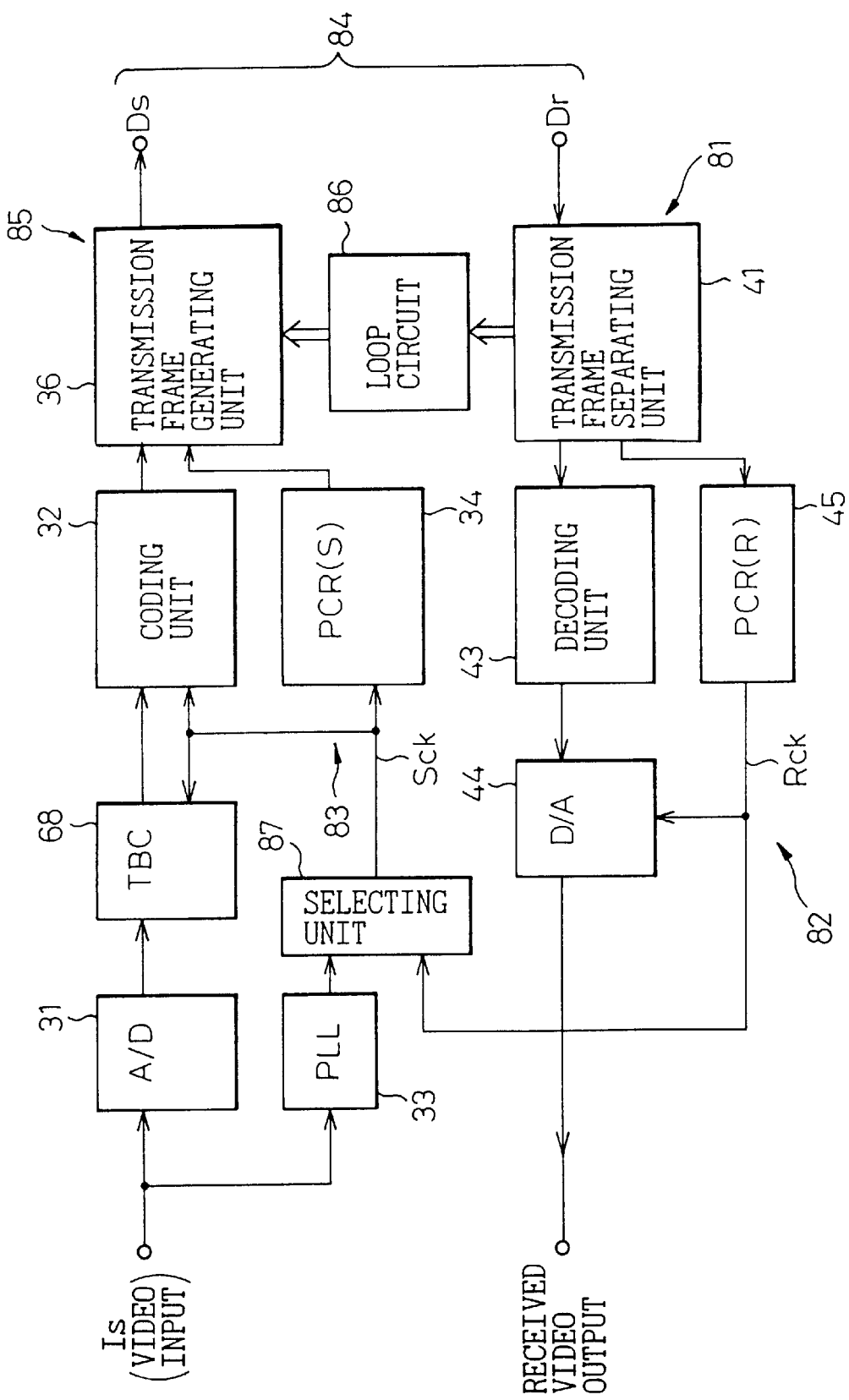
FIG. 15 is a view of a system clock reproducing apparatus according to a fifth embodiment based on a third aspect of the present invention.

FIG. 15 is a view of a system clock reproducing apparatus according to a fifth embodiment based on a third aspect of the present invention.

In the figure, the portions corresponding to the receiving unit 81, the time reference clock reproducing unit 82, and the sending side system clock generating unit 83 shown in FIG. 14 are shown with the same reference numerals 81, 82, and 83 nearby.

The received digital data Dr received from the receiving side node 10-N having the monitor 13 through the ring transmission line 84 is input to the transmission frame separating unit 41 where the second time reference clock T2 (PCR value) contained in the data Dr is separated.

The separated clock T2 (PCR value) is received by the PCR reproducing unit 45 where the received system clock Rck is reproduced. This system clock Rck is supplied through a later explained selector 87 to the PCR generating unit 34 as the system clock Sck of that node.

Therefore, the first time reference clock T1 (PCR value) generated based on this system clock Sck is coupled with the video digital signal from the coding unit 32 to generate the transport stream of the MPEG2. This is sent as the sent digital data Ds through the ring transmission line 84 to the receiving side node 10-N.

In this case, provision is made of a loop circuit 86 for making the digital data Dr obtained from the receiving unit 81 be bypassed as it is to the ring transmission line 84 through the transmission unit 85 of the sending side node. The loop circuit 86 performs the above bypass operation only when the sending side node is not sending digital data Ds.

Further, preferably provision is made of a selector for selectively inputting to the sending side system clock generating unit 83 either the clock extracted from the original data (Is) to be sent as the digital data Ds from the sending side node or the second time reference clock T2 reproduced by the time reference clock reproducing unit 82.

Depending on how the CODEC of the sending side node is designed, there is also an apparatus suited to one-way transmission where the received digital data Dr is not handled and only the sent digital data Ds is handled. At this time, since there is no data Dr and the clock T2 is not input, the system clock Sck has to be generated by the clock extracted from the video input through the PLL circuit 33. Therefore, the selector 87 is provided.

The time base corrector function explained in FIG. 11 is necessary when the selector 87 selects the clock Rck generated based on the clock T2 separated from the received digital data Dr. Therefore, the time base corrector 68 operating in synchronization with the clock selected by the selector 87 is provided.

Further, a configuration provided with a decoding unit 43 for reproducing the original data from the digital data Dr obtained from the receiving unit 81 is shown in FIG. 15, but the decoding unit 43 is not always necessary. This is because a sending side node having a camera 12 often functions as a dedicated sending node. This is shown in FIG. 16.

Figure 16:
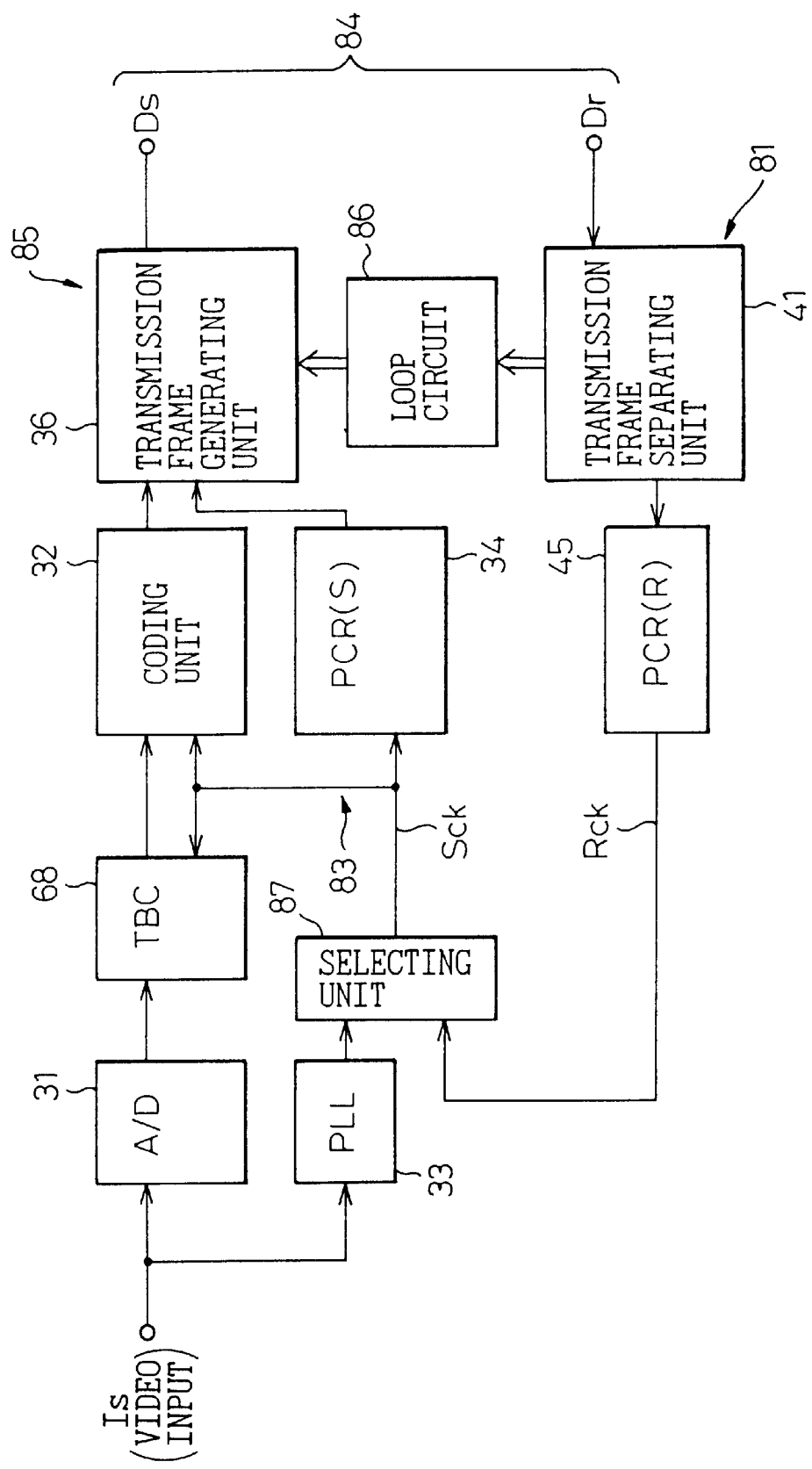
FIG. 16 is a view of a modification of the apparatus of FIG. 15.

FIG. 16 is a view of a modification of the apparatus of FIG. 15. This modification shows the above dedicated sending node from which configuration the decoding portion of FIG. 15 has been removed. Therefore, naturally, there is no received video output.

As explained above, according to the fifth embodiment, the operation of the sending side nodes includes the following steps:

Step S31: The sending side nodes (10-1, 10-2 . . . ) commonly receive at the receiving unit 81 the digital data Dr including the second time reference clock T2 sent from the receiving side node (10-N) through the ring transmission line 84.

Step S32: They reproduce at the reproducing unit 82 the second time reference clock T2 (Rck) from the commonly received digital data Dr.

Step S33: They generate at the clock generating unit 83 the system clock Sck serving as the operation base at the sending side nodes in synchronization with the reproduced second time reference clock T2.

Further, there is the step of making the received digital data Dr be bypassed through the loop circuit 86 to the ring transmission line 84 when the sending side node does not send digital data Ds.

Further, there is a step of selecting by the selector 87 and selectively using either the clock extracted from the original data to be sent from the sending side node as the digital data Ds or the second time reference clock T2 (Rck) reproduced, when generating the system clock Sck.

Further, there is a step of synchronizing, by giving the sending side node a time base corrector function by the time base corrector 68, the clock for sending the digital data Ds from the sending side node to the ring transmission line 84 with the above selected clock.

Further, there is a step, performed by the decoding unit 43, of decoding the commonly received digital data Dr to reproduce the original data.

Figure 17:
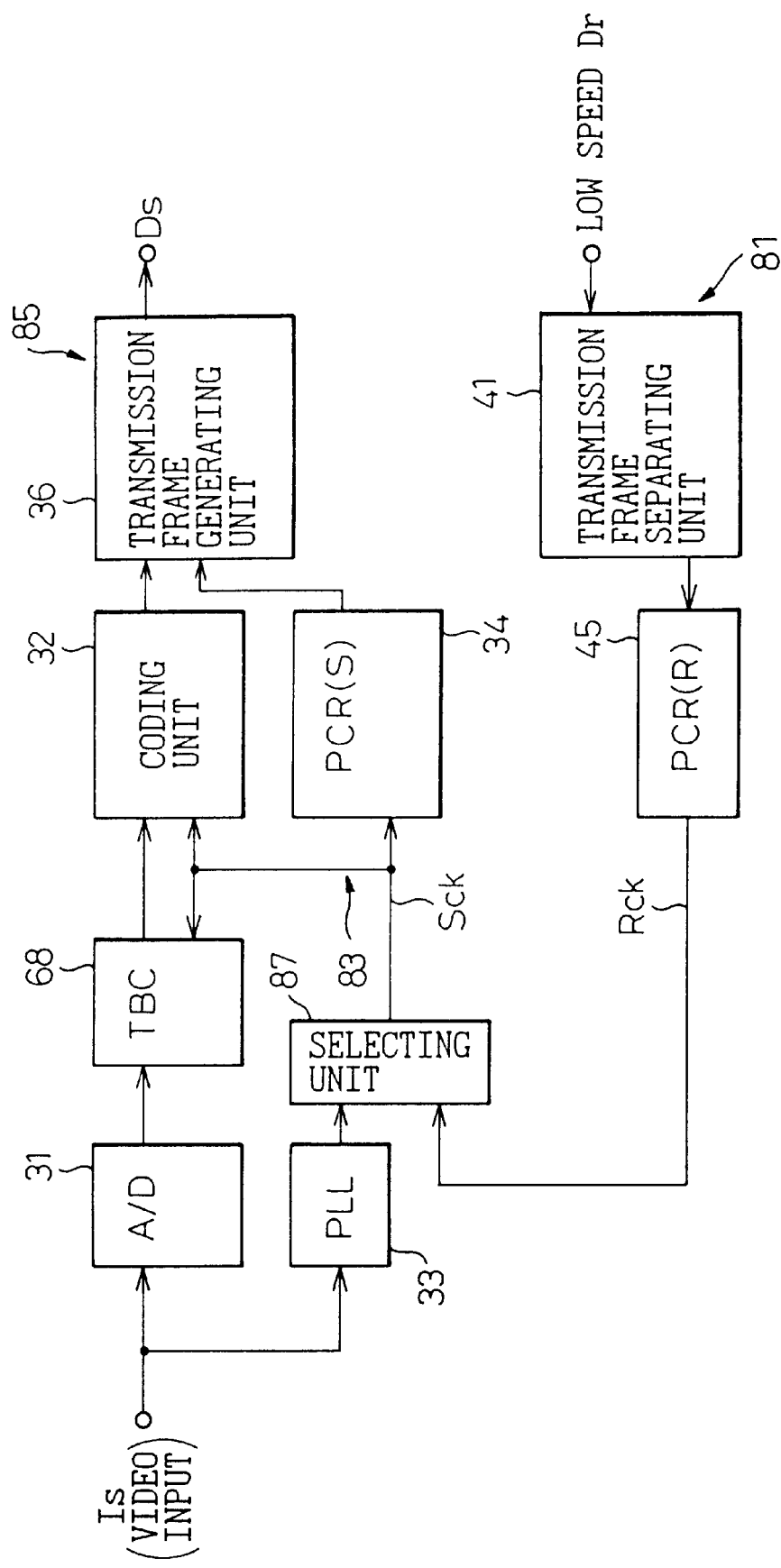
FIG. 17 is a view of a modification of the fifth embodiment.

FIG. 17 is a view of a modification of the fifth embodiment.

The operation of the modification of the fifth embodiment of the figure includes the following steps.

Step S41: The sending side nodes (10-1, 10-2 . . . ) commonly receive the second time reference clock T2 multiplexed to a low speed data channel in the digital data Dr sent from the receiving side node (10-N) through the ring transmission line 84.

Step S42: They then extract the second time reference clock T2 from the commonly received low speed digital data Dr.

Step S43: They generate the system clock Sck serving as their operation bases at the sending side nodes in synchronization with the extracted second time reference clock T2 (Rck).

When the ring transmission line 84 is for example a 50 Mbps optical transmission channel, the video signal is sent over the 6 Mbps band and the control signal over the 1.5 Mbps band by the TDMA mode. The above steps S41 to S43 become possible by noting that low speed transmission is sufficient for the transmission of the time reference clock information only.

According to another modification, the operation of the apparatus includes the following steps:

Step S51: The sending side nodes receive in common a second time reference clock T2 sent from the receiving side node through a low speed data channel given different from the ring transmission line 84.

Step S52: They extract the commonly received second time reference clock.

They generate the system clocks Sck serving as their operation bases at the sending side nodes in synchronization with the extracted second time reference clock T2 (Rck).

Figure 18:
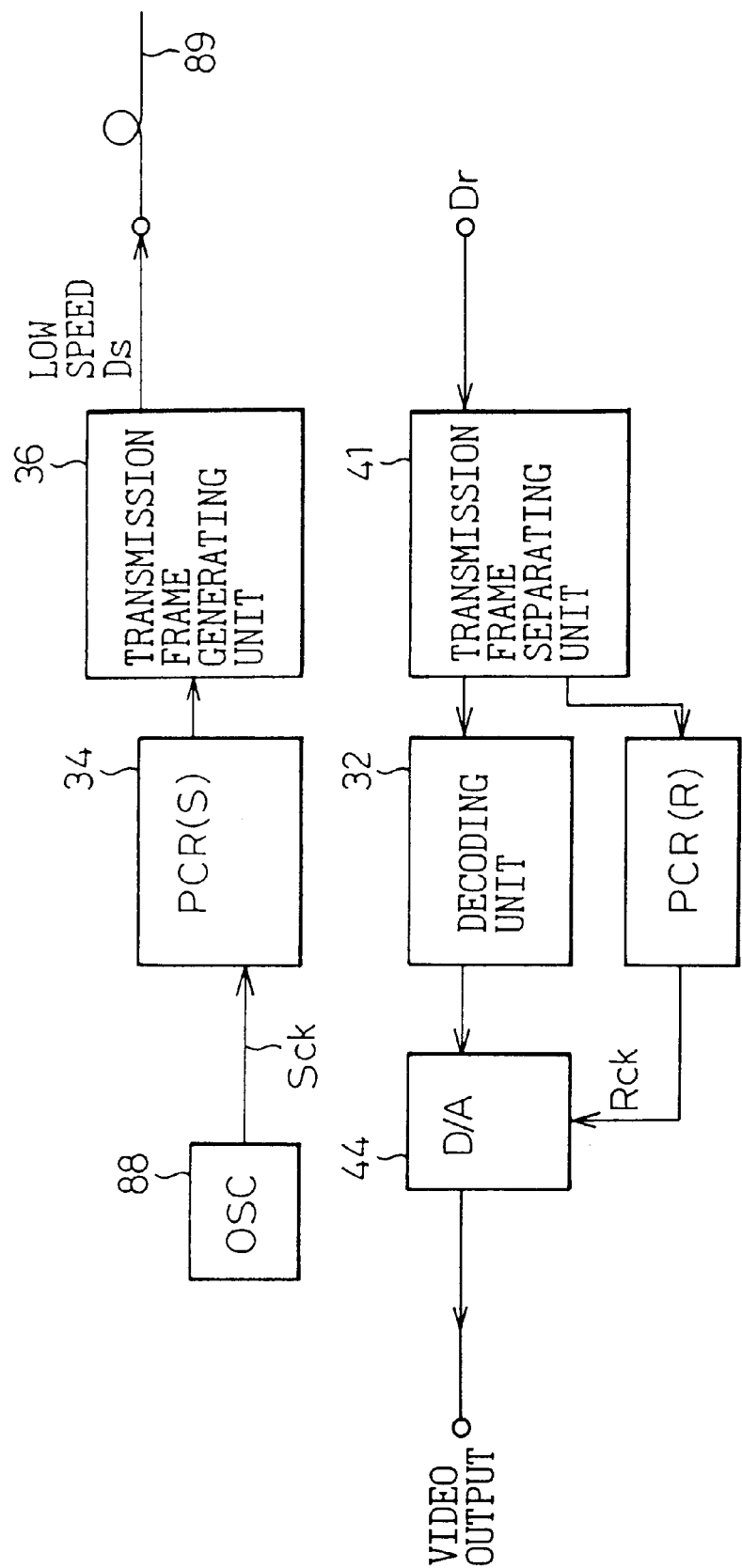
FIG. 18 is a view of the configuration for outputting low speed transmission data.

FIG. 18 is a view of the configuration for outputting low speed transmission data.

In the figure, the receiving side node 10-N sends the clock T2 to the above low speed data channel 89. This low speed data channel 89, for example, a telephone channel, is connected to the sending side nodes 10-1, 10-2 . . . .

The low speed data (PCR value of clock T2) to the low speed data channel 89 is generated in synchronization with the signal of the low frequency oscillator (OSC) 88 unique to the node 10-N.

Summarizing the effect of the present invention, as explained above, when receiving and reproducing video or other information at a receiving side node selectively from a plurality of sending side nodes, even if there is channel switching from one sending side node to another sending side node, there is no repull-in operation at the receiving side node at the time of switching and therefore a high quality image free of color irregularity can be obtained.

What is claimed is:

1. A method for reproducing a system clock in a digital data transmission network comprising:

a first step of receiving digital data containing a first time reference clock from a sending side node and reproducing the first time reference clock at a receiving side node, a second step of generating a system clock serving as an operation base in said receiving side node, a third step of generating a second time reference clock serving as a time base in said receiving side node in synchronization with the system clock, a fourth step of calculating a first difference between adjoining counts of said first time reference clock in a receiving time interval, a fifth step of calculating a second difference between adjoining counts of said second time reference clock in the receiving time interval, and a sixth step of generating the system clock, based on said first difference of the reproduced first time reference clock and said second difference of the generated second time reference clock, so as to make a deviation between these time reference clocks converge.

2. A method for reproducing a system clock as set forth in claim 1, further comprising a step of monitoring an error between said first difference obtained by said fourth step and said second difference obtained by said fifth step and temporarily stopping the convergence by said sixth step when the error exceeds an allowable error.

3. A method for reproducing a system clock as set forth in claim 1, further comprising a step of giving a time base corrector function at the sending side node and synchronizing the system clock serving as the operation base in the sending side node with a channel clock for sending said digital data from said sending side node on a channel.

4. A method for reproducing a system clock as set forth in claim 1 wherein:
a plurality of sending side nodes are inserted together with said receiving side node in a ring transmission line and further comprising:
a step of having the sending side nodes commonly receive the second time reference clock multiplexed to a low speed data channel in the digital data sent from said receiving side node through said ring transmission line,
a step of extracting the second time reference clock from the commonly received digital data, and
a step of generating the system clock serving as an operation base at the sending side node in synchronization with the extracted second time reference clock.

5. A method for reproducing a system clock as set forth in claim 1 wherein:
a plurality of sending nodes are inserted together with said receiving side node in a ring transmission line and further comprising:
a step of having the sending side nodes commonly receive the second time reference clock sent from said receiving side node through a low speed data channel given different form said ring transmission line,
a step of extracting said commonly received second time reference clock, and
a step of generating a system clock serving as an operating reference at the sending side node in synchronization with the extracted second time reference clock.

6. A method for reproducing a system clock in a digital data transmission network comprising:
a first step of receiving digital data containing a first time reference clock sent selectively from N (N=2, 3 . . . ) number of sending side nodes and reproducing the first time reference clock at a receiving side node,
a second step of generating a system clock serving as an operation base at said receiving side node,
a third step of generating a second time reference clock serving as a time base at said receiving side node in synchronization with the system clock,
a fourth step of receiving the sent digital data, finding a relative value between first time reference clocks for each sending side node reproduced, and holding the same in correspondence with the sending side nodes, and
a fifth step of reading said relative value corresponding to a sending side node sending the received digital data and adding it to said second time reference clock generated.

7. A method for reproducing a system clock as set forth in claim 6, comprising, in said fourth step:
using a count of the first time reference clock for a sending side node originating the received digital data as a reference value and
using the difference between the successively received counts of the first time reference clocks for the sending side nodes and said reference value as the relative values for the sending side nodes.

8. A method for reproducing a system clock as set forth in claim 6, wherein:
a plurality of sending side nodes are inserted together with said receiving side node in a ring transmission line and further comprising:
a step of having the sending side nodes commonly receive second time reference clock multiplexed to a low speed data channel in the digital data sent from said receiving side node through said ring transmission line,
a step of extracting the second time reference clock from the commonly received digital data, and
a step of generating the system clock serving as an operation base at the sending side node in synchronization with the extracted second time reference clock.

9. A method for reproducing a system clock as set forth in claim 6, wherein:
a plurality of sending side nodes are inserted together with said receiving side node in a ring transmission line and further comprising:
a step of having the sending side nodes commonly receive the second time reference clock sent from said receiving side node through a low speed data channel given different from said ring transmission line,
a step of extracting said commonly received second time reference clock, and
a step for generating a system clock serving as an operation base at the sending side node in synchronization with the extracted second time reference clock.

10. A method for reproducing a system clock in a digital data transmission network wherein a ring transmission line is formed by a plurality of sending side nodes each having a sending port (S) and a receiving port (R) and one receiving side node having a sending (S) and a receiving port (R), which ports are connected such that the sending port (S) of each node is coupled to the receiving port of another node adjacent thereto comprising:
a step of having the sending side nodes commonly receive digital data containing a time reference clock sent from said receiving side node through said ring transmission line,
a step of reproducing a time reference clock from the commonly received digital data,
a step of generating a system clock serving as an operation base at a sending side node in synchronization with the reproduced time reference clock, and
a step of selecting and selectively using either a clock extracted from original data to be sent as digital data from the sending side node or the second time reference clock reproduced when generating the system clock.

11. A method for reproducing a system clock as set forth in claim 10, further comprising a step of causing the received digital data to be bypassed to the ring transmission line when a sending side node does not send digital data.

12. A method for reproducing a system clock as set forth in claim 10, further comprising a step of giving a time base corrector function to the sending side node and synchronizing the clock for sending said digital data from said sending side node to the ring transmission line with said selected clock.

13. A method for reproducing a system clock as set forth in claim 10, further comprising a step of decoding for reproducing the original data from the commonly received digital data.

14. An apparatus for reproducing a system clock in a digital data transmission network comprising:
a time reference clock reproducing unit for receiving digital data including a first time reference clock sent from a sending side node and reproducing said first time reference clock at said receiving side node,
a system clock generating unit for generating a system clock serving as an operating base at the receiving side node, a time reference clock generating unit for receiving as input a system clock from said system clock generating unit and generating a second time reference clock serving as a time base at the receiving side node, a synchronization control unit for controlling said system clock generating unit, based on the reproduced first time reference clock and the generated second time reference clock, so as to minimize the deviation between these clocks, a first difference calculating means for calculating a first difference between adjoining counts of the first time reference clock at a receiving time interval, and a second difference calculating means for calculating a second difference between adjoining counts of the second time reference clock at a receiving time interval, wherein the system clock is generated by inputting said first difference and second difference outputted respectively from the first and second difference calculating means to the synchronization control unit to make the deviation between the time reference clocks converge.

15. An apparatus for reproducing a system clock as set forth in claim 14, wherein:

said first difference calculating means is comprised of a first delay circuit receiving as input said first time reference clock and a first subtracting circuit receiving as input both of the first time reference clock of the input side of said first delay circuit and said first time reference clock of the output side of the first delay circuit and obtaining the difference between the two and said second difference calculating means is comprised of a second delay circuit receiving as input said second time reference clock and a second subtracting circuit receiving as input both of the second time reference clock of the input side of said second delay circuit and said second time reference clock of the output side of the second delay circuit and obtaining the difference between the two.

16. An apparatus for reproducing a system clock as set forth in claim 14, further comprising a limiter for monitoring an error between said first difference from said first difference calculating means and said second difference from said second difference calculating means and temporarily stopping the control by the synchronization control unit when that error exceeds an allowable error.

17. An apparatus for reproducing a system clock as set forth in claim 14, further comprising, in said sending side node, a time base corrector for generating a system clock serving as an operation base at said sending side node in synchronization with a channel clock for sending said digital data from said sending side node to a channel and operating in synchronization with the system clock.

18. An apparatus for reproducing a system clock in a digital data transmission network comprising:

a time reference clock reproducing unit for receiving digital data including a first time reference clock sent from a sending side node and reproducing said first time reference clock at said receiving side node, a system clock generating unit for generating a system clock serving as an operation base at the receiving side node, a time reference clock generating unit for receiving as input a system clock from said system clock generating unit and generating a second time reference clock serving as a time base at the receiving side node, a synchronization control unit for controlling said system clock generating unit, based on the reproduced first time reference clock and the generated second time reference clock, so as to minimize the deviation between these clocks converge, a time reference clock correction table for receiving digital data selectively sent from N (N=2, 3 . . . ) number sending side nodes, finding relative values between the first time reference clocks of the sending side nodes reproduced by said time reference clock reproducing unit, and holding the results in correspondence with the sending side nodes, and an adding unit for reading a relative value corresponding to a sending side node sending the received digital data from said time reference clock correction table and adding it to the second time reference clock from said time reference clock generating unit.

19. An apparatus for reproducing a system clock as set forth in claim 18, further comprising a relative value generating unit for generating said relative values to be held in said time reference clock correction table.

20. An apparatus for reproducing a system clock as set forth in claim 18, further comprising a selector for selectively inputting to said sending side system clock generating unit either the clock extracted from the original data to be sent as digital data from said sending side node or the second time reference clock reproduced by said time reference clock reproducing unit.

21. An apparatus for reproducing a system clock in a digital data transmission network wherein a ring transmission line is formed by a plurality of sending side nodes each having a sending port (S) and a receiving port (R) and one receiving side node having a sending port (S) and a receiving port (R), which ports are connected such that the sending port (S) of each node is coupled to the receiving port of another node adjacent thereto, comprising:

a receiving unit for commonly receiving digital data including a time reference clock sent from said receiving side node through said ring transmission line, a time reference clock reproducing unit for reproducing the time-reference clock from said digital data obtained form said receiving unit, a sending side system clock generating unit for generating a system clock serving as an operation base at said sending side node in synchronization with the reproduced time reference clock, and a selector for selectively inputting to said sending side system clock generating unit either the clock extracted from the original data to be sent as digital data from said sending side node or the second time reference clock reproduced by said time reference clock reproducing unit.

22. An apparatus for reproducing a system clock as set forth in claim 21, further comprising a loop circuit for making said digital data obtained from the receiving unit to be bypassed as it is to said ring transmission line through a sending unit of said sending side node, said loop circuit performing the bypass operation only when the sending side node does not send digital data.

23. An apparatus for reproducing a system clock as set forth in claim 21, further comprising a time base corrector operating in synchronization with the clock selected by said selector.

24. A system clock reproducing apparatus as set forth in claim 21, further comprising a decoding unit for reproducing the original data from the digital data obtained from said receiving unit.

* * * * *